(12) United States Patent
Friedrich

(10) Patent No.: US 8,729,892 B2
(45) Date of Patent: May 20, 2014

(54) DIFFERENTIAL MAGNETIC FIELD SENSOR STRUCTURE FOR ORIENTATION INDEPENDENT MEASUREMENT

(75) Inventor: Andreas P. Friedrich, Metz-Tessy (FR)

(73) Assignee: Allegro Microsystems, LLC, Worcester, MA (US)

( * ) Notice: Subject to any disclaimer, the term of this patent is extended or adjusted under 35 U.S.C. 154(b) by 403 days.

(21) Appl. No.: 13/078,200

(22) Filed: Apr. 1, 2011

(65) Prior Publication Data

US 2012/0249133 A1 Oct. 4, 2012

(51) Int. Cl.
*G01R 33/02* (2006.01)

(52) U.S. Cl.
USPC .......................................................... 324/247

(58) Field of Classification Search
USPC .......... 324/247, 207.18, 207.11, 207.13, 260, 324/207.25, 207.2, 207.21, 207.24, 324/173–174
See application file for complete search history.

(56) References Cited

U.S. PATENT DOCUMENTS

| | | | |
|---|---|---|---|
| 5,241,267 A | 8/1993 | Gleixner et al. | |
| 5,463,318 A * | 10/1995 | Duret | 324/301 |
| 6,570,376 B2 * | 5/2003 | Matsui et al. | 324/207.21 |
| 6,882,142 B2 | 4/2005 | Koike et al. | |
| 6,937,008 B2 | 8/2005 | Matsuzaki et al. | |
| 7,235,968 B2 | 6/2007 | Popovic et al. | |
| 7,365,530 B2 | 4/2008 | Bailey et al. | |
| 2003/0173955 A1 * | 9/2003 | Uenoyama | 324/207.21 |
| 2008/0278158 A1 * | 11/2008 | Granig et al. | 324/247 |
| 2009/0058404 A1 | 3/2009 | Kurumado | |
| 2010/0007340 A1 | 1/2010 | Kaita et al. | |
| 2010/0026282 A1 | 2/2010 | Kaita et al. | |
| 2010/0181993 A1 | 7/2010 | Fernandez et al. | |
| 2011/0048102 A1 | 3/2011 | Fernandez et al. | |
| 2011/0074406 A1 * | 3/2011 | Mather et al. | 324/252 |
| 2012/0025817 A1 * | 2/2012 | Romero et al. | 324/251 |

OTHER PUBLICATIONS

Notification of Transmittal of the International Search Report and the Written Opinion of the International Searching Authority, or the Declaration, dated May 29, 2012, PCT/US2012/028164, p. 1.
The International Search Report dated May 29, 2012, PCT/US2012/028164, pp. 1-4.
Written Opinion of the International Searching Authority dated May 29, 2012, PCT/US2012/028164, pp. 1-13.
Allegro Datasheet ATS657, "Dynamic, Self-Calibrating, Threshold-Detecting, Differential Speed and Direction Hall—Effect Gear tooth Sensor IC," 2009, 15 pages.
Allegro Datasheet ATS682LSH, "Miniature, Two-Wire, True Zero Speed Differential Peak-Detecting Sensor IC," 2009, 16 pages.
Notification, International Preliminary Report on Patentability dated Oct. 10, 2013, for PCT Application No. PCT/US2012/028164, filed Mar. 8, 2012, 14 pages.
Response dated Feb. 12, 2014 to EPO Communication with invitation to correct deficiencies noted in the written opinion, for EP Application No. 12712456.8, filed Sep. 23, 2013, 23 pages.

\* cited by examiner

*Primary Examiner* — Patrick Assouad
*Assistant Examiner* — Demetrius Pretlow
(74) *Attorney, Agent, or Firm* — Daly, Crowley, Mofford & Durkee, LLP

(57) ABSTRACT

A differential magnetic field sensor that enables operation that is independent of sensor-to-target orientation is presented. The differential magnetic field sensor is provided with at least two differential channels. Each differential channel includes a pair of magnetic field sensing elements and has a respective sensing axis defined by those magnetic field sensing elements. The sensing axes are not aligned with respect to each other. One sensing axis is positioned relative to a reference axis of a target profile to define an orientation angle between the sensing axis and the reference axis. The differential magnetic field sensor includes circuitry to produce differential signals associated with the differential channels and use those differential signals to produce a single differential signal having an amplitude that is independent of the orientation angle.

28 Claims, 19 Drawing Sheets

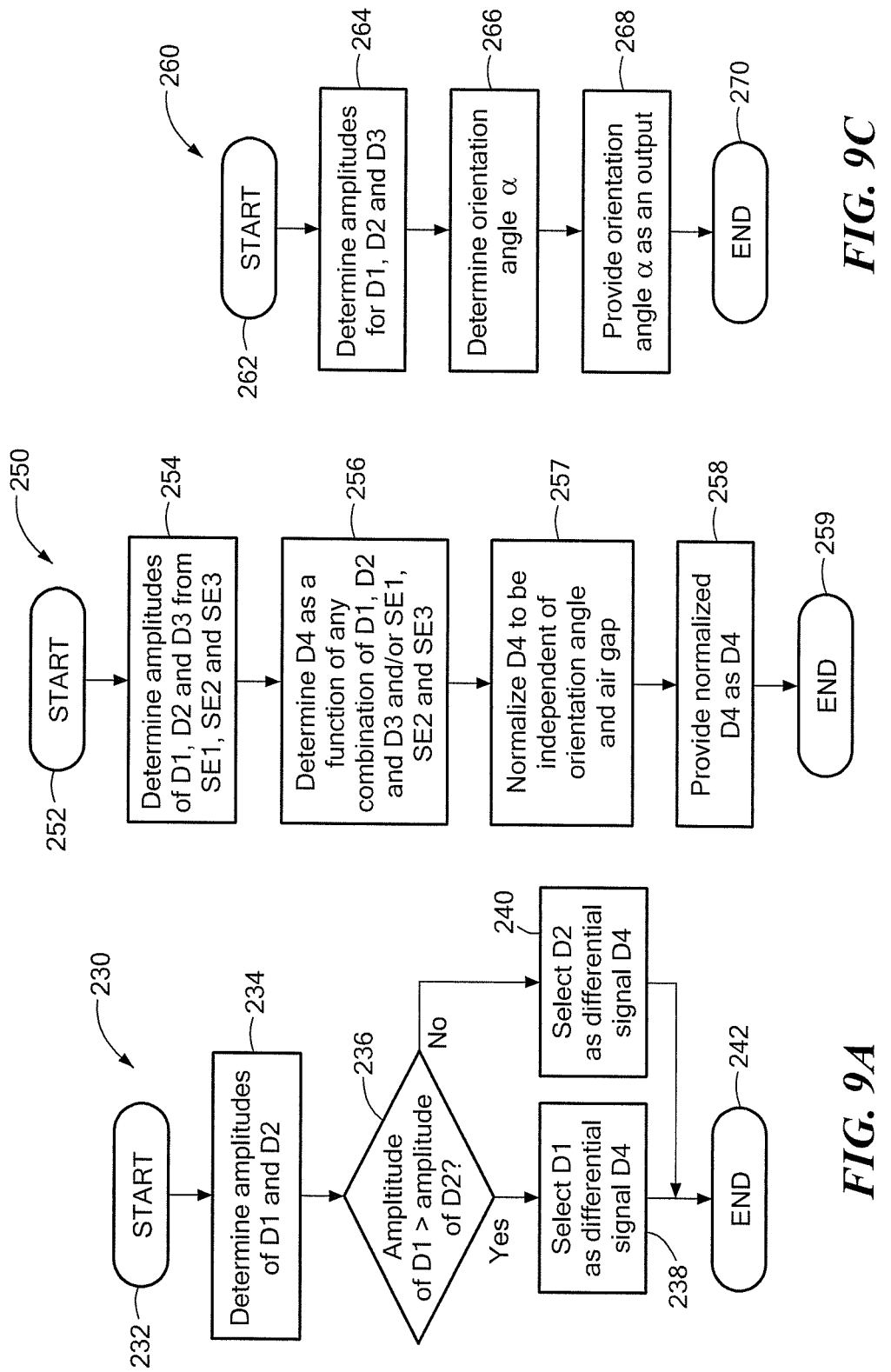

DIFFERENTIAL MAGNETIC FIELD SENSOR STRUCTURE FOR ORIENTATION INDEPENDENT MEASUREMENT

CROSS-REFERENCE TO RELATED APPLICATIONS

Not applicable.

STATEMENT REGARDING FEDERALLY SPONSORED RESEARCH

Not applicable.

FIELD OF THE INVENTION

This invention relates generally to magnetic field sensors and more particularly, to differential magnetic field sensors.

BACKGROUND OF THE INVENTION

Magnetic field sensors that sense the rotational motion of a target are known. The target can be a magnetic or ferrous target. Such sensors detect the features of the rotating target's profile, for example, teeth/valleys of a ferrous gear target or north/south poles of a magnetic target such as a ring magnet.

The magnetic field associated with the target profile is sensed by a magnetic field sensing element, such as Hall element or magnetoresistive (MR) element. As the target passes the sensing element, the magnetic field experienced by the sensing element varies in relation to the target profile. The sensing element provides a signal proportional to the sensed magnetic field. The sensor processes the magnetic field signal to generate an output, for example, a signal that changes state each time the magnetic field signal crosses a threshold. Such an output can be used to provide rotational speed information. A second sensing element can be employed to generate an output for rotational direction detection as well.

Some sensors, referred to as differential sensors, contain two sensing elements configured in a differential arrangement. In differential magnetic field sensors, the difference between the signals provided by the two sensing elements is used to generate a differential magnetic field signal indicative of transitions in the target's features. As the differential magnetic field sensor only responds to changes in magnetic field strength, it is relatively immune to interference. Differential sensors containing three or more sensing elements can be used to provide rotational speed and direction information.

Unlike the non-differential sensing type magnetic field sensor, the differential magnetic field sensor is orientation dependent with respect to the target. Thus, when a differential magnetic field sensor is used to measure the speed (or direction) of a rotating target, the pair of sensing elements has to be centered over the target's profile for optimum performance. Misalignment of the sensing elements relative to the target profile results in a reduction of the peak-to-peak differential signal. Consequently, applications that cannot control the sensor-to-target alignment usually employ a non-differential sensing type sensor.

SUMMARY OF THE INVENTION

In general, in one aspect, the invention is directed to a differential magnetic field sensor. The differential magnetic field sensor includes a first differential channel and a second differential channel. The first differential channel includes a first pair of magnetic field sensing elements and has an associated first sensing axis defined by the first pair of magnetic field sensing elements. The second differential channel includes a second pair of magnetic field sensing elements and has a second sensing axis defined by the second pair of magnetic field sensing elements. The second sensing axis is not aligned with respect to the first sensing axis. The first sensing axis is positioned relative to a reference axis of a target profile to define an orientation angle between the first sensing axis and the reference axis. The differential magnetic field sensor further includes circuitry, coupled to the magnetic field sensing elements, to produce as an output a single differential signal having an amplitude that is orientation independent of the orientation angle.

Embodiments of the invention may include one or more of the following features. The circuitry can include circuitry to produce a first differential signal associated with the first differential channel and a second differential signal associated with the second differential channel, and the circuitry can further include a differential signal generator to receive as inputs the first and second differential signals and to produce as an output the single differential signal. The first and second differential signals will have amplitudes that are dependent on the orientation angle. Where the first differential signal has a first amplitude and the second differential signal has a second amplitude, the differential signal generator can operate to select the first differential signal as the single differential signal when an absolute value of the first amplitude is greater than an absolute value of the second amplitude and the differential signal generator can operate to select the second differential signal as the single differential signal when the absolute value of the first amplitude is not greater than the absolute value of the second amplitude. The circuitry can also include circuitry to receive as inputs a first magnetic field sensing output signal associated with the first sensing element, a second magnetic field sensing output signal associated with the second sensing element and a third magnetic field sensing output signal associated with the third sensing element. The differential signal generator can operate to produce the single differential signal by combining mathematically any two or more of the first magnetic field sensing output signal, the second magnetic field sensing output signal, the third magnetic field sensing output signal, the first differential signal and the second differential signal.

While this orientation angle independent differential sensing solution is well-suited for use in systems with rotary motion targets, it is also applicable to linear motion systems (in particular, industrial applications, e.g., rack rail and magnetic ruler) as well.

BRIEF DESCRIPTION OF THE DRAWINGS

The foregoing features of the invention, as well as the invention itself, may be more fully understood from the following detailed description of the drawings, in which:

FIGS. 9A-9C are flow diagrams showing alternative exemplary operations of the differential signal generator of FIGS. 4A-D and 6.

DETAILED DESCRIPTION

Figure 1A:
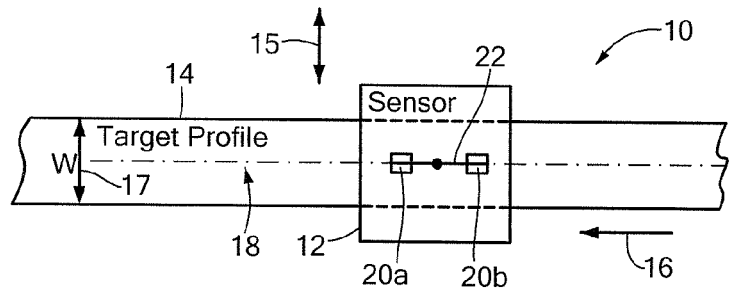
FIGS. 1A-1B are pictorial representations of a sensing arrangement in which a rotary motion detecting magnetic field sensor and target profile of rotation are aligned (FIG. 1A) and not aligned (FIG. 1B)

Referring to FIG. 1A, a sensing arrangement 10 in which a magnetic field sensor 12 is arranged in a radial sensing position relative to a rotating target profile 14 is shown. An axis of rotation is indicated by arrow 15. A direction of motion of the rotating target profile 14 is indicated by arrow 16. Although shown in one direction, the motion could be in the opposite direction or both directions. The target profile 14, which has a width "W" 17, faces the "front" of the magnetic field sensor 12. The mid-point of the face width is indicated by a centerline 18 and referred to herein as the target profile's reference axis. The magnetic field sensor 12 is a differential sensing device and, as such, includes two sensing elements 20a and 20b for generating a differential signal responsive to change in magnetic field strength at a location relative to the target profile 14. That location corresponds to a differential channel (not shown). Associated with the differential channel is a sensing axis 22 as defined by the arrangement of the sensing elements 20a, 20b.

In the illustration of FIG. 1A, the magnetic field sensor 12 is centered over the target profile 14 so that the sensing axis 22 is positioned approximately parallel to the target profile edges and aligned with the reference axis 18. The sensing axis 22 need not be exactly centered over the centerline 18 (as it is depicted in the figures) to be considered "aligned". That is, the sensing axis 22 may be somewhat offset from but parallel to the centerline 18. The width W must be large enough so that positioning of the sensing elements 20a, 20b is not too close to the target profile's edge, however, because of flux distortions in those areas.

The differential mode of operation requires careful adjustment of the sensor 12 to achieve that alignment. In some applications, the sensor alignment to the target cannot be guaranteed. Typically, sensor-target orientation offset or misalignment occurs at installation time, that is, when the sensor is installed near the target. For example, the sensor may be mounted in a threaded housing that is screwed into an installation location and the installation process may be controlled by monitoring only the torque. Alternatively, the sensor or the housing in which it is contained may be mounted to a surface at the installation location in a way that results in misalignment between sensor and target profile.

Figure 1B:
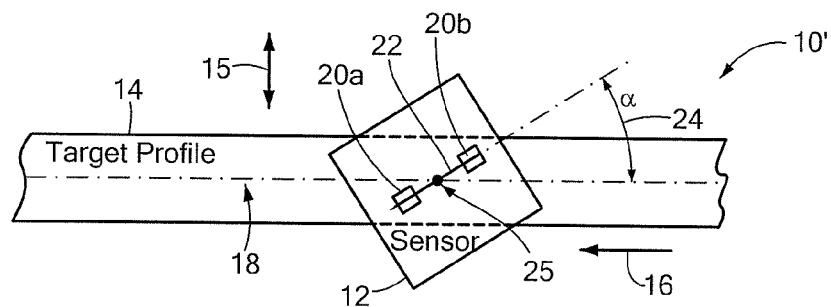

FIG. 1B shows such misalignment with a sensing arrangement 10'. The sensing arrangement 10' is the same as sensing arrangement 10 of FIG. 1A except that the orientation of the magnetic field sensor 12 is offset relative to the target profile 14 by an orientation angle α 24. In other words, the sensing axis 22 is no longer aligned with the reference axis 18 but is instead offset relative to the reference axis 18 by the orientation angle α 24. In this illustration, a mounting axis 25 about which sensor movement or other positioning offset can occur, for example, during installation, is centered equidistant of the two sensing elements 20a, 20b along the axis 22. The sensor misalignment causes degradation in sensor performance, as the peak-to-peak amplitude of the differential signal generated by the sensor 12 will not be at a maximum value. From an application standpoint, the consequence of reduced differential signal peak-to-peak amplitude is the reduction of maximum air gap range.

Figure 2A:
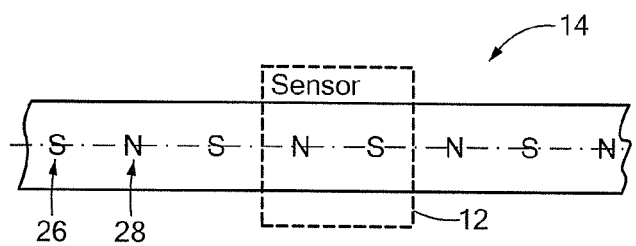
FIGS. 2A-2B are pictorial representations of the target profile defined by poles (FIG. 2A) and alternating gear wheel teeth/valleys (FIG. 2B, a side view)
Figure 2B:
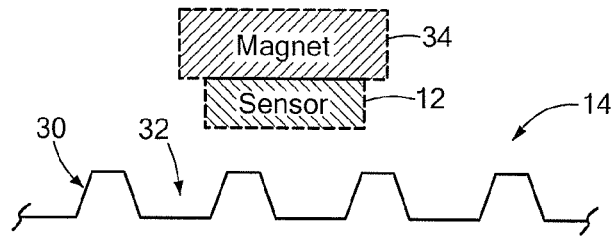

FIGS. 2A and 2B show two different example target profiles. In FIG. 2A, which shows the same "face" view of the target profile shown in FIGS. 1A-1B, the target profile 14 from FIG. 1A is defined by an alternating sequence of south and north magnetic poles 26 and 28, respectively. In FIG. 2B, the target profile 14 (shown here in a side view to more clearly illustrate the features of the target profile) is defined by an alternating pattern of a raised feature (e.g., a tooth) 30 followed by a gap 32, typically referred to as a valley or recess. The teeth or other type of raised features can have various shapes, e.g., square, triangle or other, based on design requirements. These patterns in FIGS. 2A-2B may be provided along the circumference of the rotating target, e.g., a permanent magnet such as a ring magnet, or some other type of multi-pole magnet, or ferrous object such as a toothed gear wheel, either radially (i.e., along the outer rim or edge of the wheel or ring magnet) as shown in FIGS. 1A and 2A, or axially (not shown). In an axial sensing arrangement with a ring magnet, the target profile of alternating poles would be defined on a broad surface of the ring magnet instead.

A differential sensor such as sensor 12 detects motion of rotating ferrous and magnetic targets by measuring the differential flux density of the magnetic field. Referring back to FIG. 2B, to detect ferrous targets the magnetic field must be provided by a back biasing permanent magnet 34, e.g., the south or north pole of the magnet 34 may be attached to (or positioned near) the "back" of the sensor 12, i.e., the side that does not face the target profile 14, as shown.

Misalignment of the type depicted in FIG. 1B can be prevented, but only with labor-intensive monitoring or specially designed assemblies. A new sensing scheme, presented herein, is tolerant to such misalignment. Thus, a differential sensor device incorporating this new scheme will operate effectively whether the orientation angle α is zero degrees (perfect alignment) or some random value greater than zero degrees.

FIGS. 3A-3G, FIGS. 4A-D, FIGS. 5A-5C and FIG. 6 show arrangements that utilize multiple magnetic field sensing elements (or, simply, "sensing elements") to realize multiple differential channels. With these arrangements a differential sensor that is orientation independent (relative to the target profile) can be achieved, as will be discussed in further detail below.

In one exemplary embodiment, and referring to FIGS. 3A-3F, an arrangement based on the use of three sensing elements is shown. As shown in FIGS. 3A-3F, a magnetic field sensing structure 40 has a configuration of three sensing elements 42a, 42b, 42c (also labeled "SE1", "SE2", and SE3", respectively) for use in a differential magnetic field sensor. The sensing elements 42a, 42b, 42c are spaced apart by some fixed distance. The physical placement of the sensing elements 42a, 42b, 42c near a target allows the sensing elements to be used to generate multiple differential signals responsive to change in magnetic field strength at respective locations relative to that target's profile (like target profile 14 of FIG. 1A, FIGS. 2A-2B). Those locations correspond to differential channels, shown in FIGS. 4A-4B and described in further detail later.

Figure 3A:
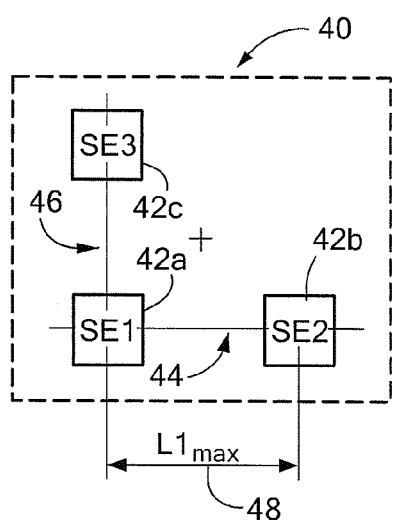
FIGS. 3A-3G are pictorial representations of an exemplary magnetic field sensing structure that includes three sensing elements configured for orientation independent, differential sensing (with FIG. 3G showing an exemplary structure with additional sensing elements to support rotational speed and direction detection capability)
Figure 3C:
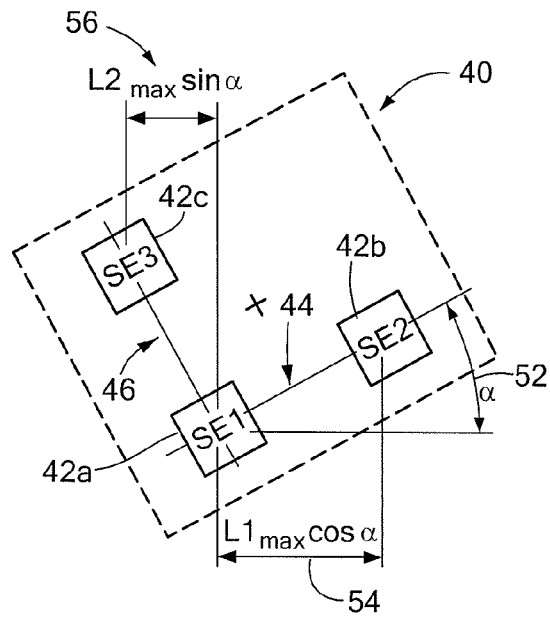
Figure 3B:
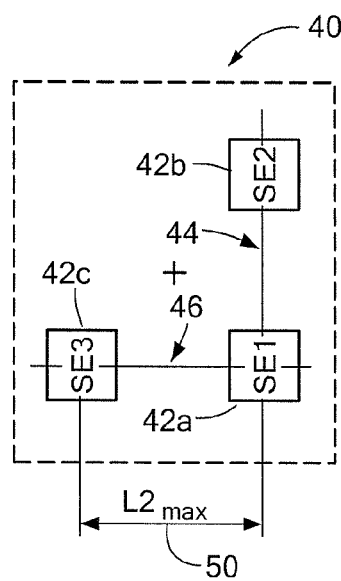

Referring to FIGS. 3A-3C, a first sensing axis 44 is defined by the arrangement of the sensing elements 42a, 42b (or first pair of differential sensing elements) and a second sensing axis 46 is defined by the arrangement of the sensing elements 42a, 42c (or second pair of differential sensing elements). Thus, in the illustrated example, the three sensing elements are spatially arranged, for example, on the surface of a sensor die (the outline of which is indicated by dashed lines), to define the two sensing axes, that is, the first sensing axis 44 and the second sensing axis 46. The sensing elements are arranged so that the two sensing axes 44, 46 are not aligned with each other in the plane of the die surface. Preferably, they are at an angle of about 90 degrees relative to each other. It will be understood, however, that a different angle could be used. In the arrangement shown in FIGS. 3A-3C and FIG. 4A, the first and second pairs of differential sensing elements share the sensing element 42a. The element-to-element spacing of the sensing elements in each pair is preferably the same (or approximately the same), but could be different.

Referring now to FIG. 3A, when the first sensing axis 44 is aligned with a target profile (that is, and referring back to FIG. 1A, it aligns with the target profile's reference axis 18), a differential signal "D1" generated by the first sensing element pair 42a, 42b will have an amplitude that is maximal ("$D1_{max}$") and a differential signal "D2" generated by the second sensing element pair 42a, 42c will have an amplitude that is zero ("$D2_{zero}$"). The distance "L1" between the sensing elements SE1 and SE2 along the reference axis is maximal (indicated as "$L1_{max}$" 48) for this orientation. The distance "L2" between the sensing elements SE1 and SE2 along the reference axis is zero. Referring to FIG. 3B, when the first sensing axis 44 is positioned at a 90 degree angle relative to the target profile's reference axis, the signal amplitude for the first differential signal D1 will be zero ("$D1_{zero}$") and signal amplitude for the second differential signal D2 will be maximal ("$D2_{max}$"). For the 90 degree shift in orientation, the distance "L2" between the sensing elements SE1 and SE3 along the reference axis is maximal (indicated as "$L2_{max}$" 50) and the distance "L1" is now zero. Referring to FIG. 3C, for a random orientation angle α 52 between the first sensing axis 44 and the target profile's reference axis, the signal amplitudes for the first differential signal D1 and the second differential signal D2 will vary with the orientation angle. For the depicted orientation, the distance L1 is equal to $L1_{max}$*cos α (indicated by reference numeral 54), and the distance L2 is equal to $L2_{max}$*sin α (indicated by reference numeral 56). It will be appreciated that $D1_{max}$ is the maximal amplitude of D1, that is, the amplitude of D1 when α is zero degrees, and $D2_{max}$ is the maximal amplitude of D2, that is, the amplitude of D2 when α is 90 degrees. Thus, these maximal amplitudes may be represented as $D1_{max}$ and $D1_{\alpha=0}$ for D1 and $D2_{max}$ and $D2_{\alpha=90}$ for D2. A single differential signal whose amplitude is independent of the orientation angle α, and referred to herein as an orientation angle independent differential signal, can be determined from D1 and D2, as will be discussed in further detail with reference to FIG. 4A. The term "orientation angle independent differential signal", as it is used herein, means that the amplitude of this single differential signal is completely or relatively independent of change in orientation angle. By "relatively orientation angle independent" it is meant that a residual change in amplitude with orientation angle can exist but is limited. In some embodiments, as later described, the residual change in amplitude with orientation angle can be compensated in the sensor circuitry.

Figure 3D:
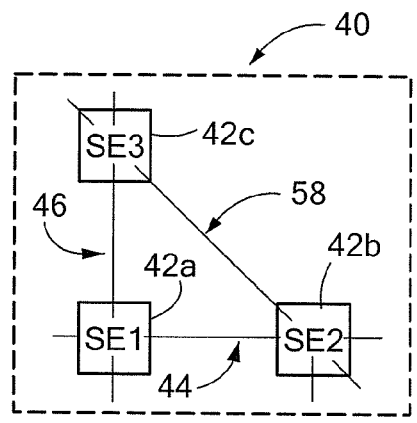
Figure 3F:
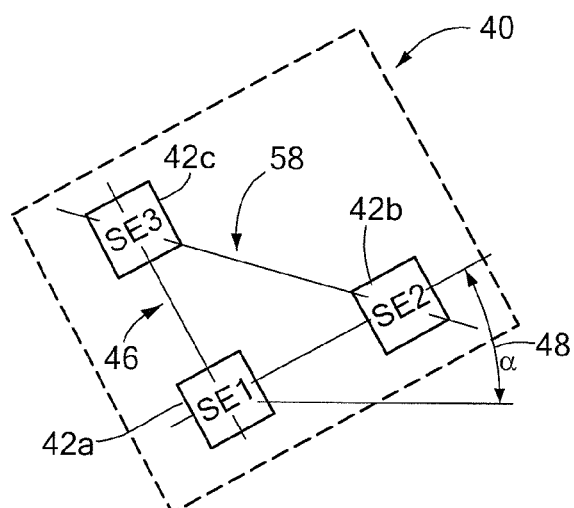
Figure 3E:
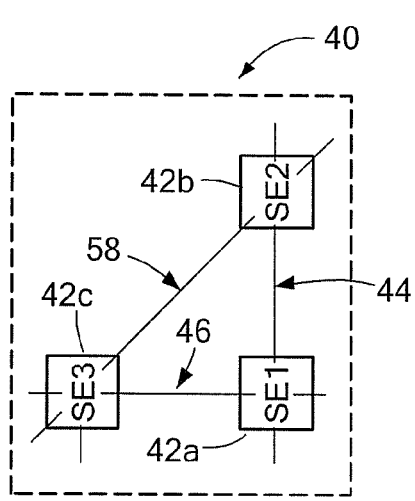

As shown in FIGS. 3D-3F, a third sensing axis 58 is defined by the arrangement of the sensing elements 42b ("SE2"), 42c ("SE3"). This third pair of sensing elements can be used to generate a third differential signal "D3". In some embodiments, for example, as illustrated in FIG. 4B, the orientation angle independent differential signal can be generated from D1, D2 and D3.

Figure 3G:
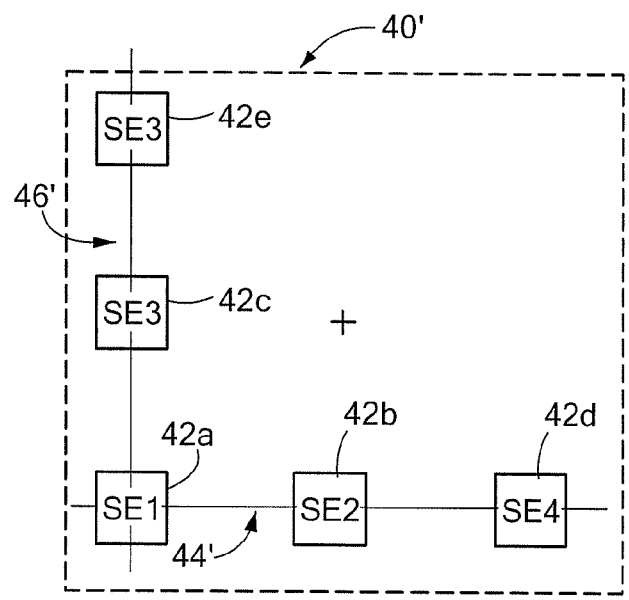

An additional element provided along each axis can be used to provide both rotational speed and direction information. As shown in FIG. 3G, a structure shown as structure 40' has three sensing elements, sensing element 42a, sensing element 42b and an additional sensing element ("SE4") 42d, aligned to form a first single sensing axis shown as sensing axis 44'. The structure 40' is further configured with three sensing elements, sensing element 42a, sensing element 42c and an additional sensing element ("SE5") 42e, aligned to form a second single sensing axis 46'.

Figure 4A:
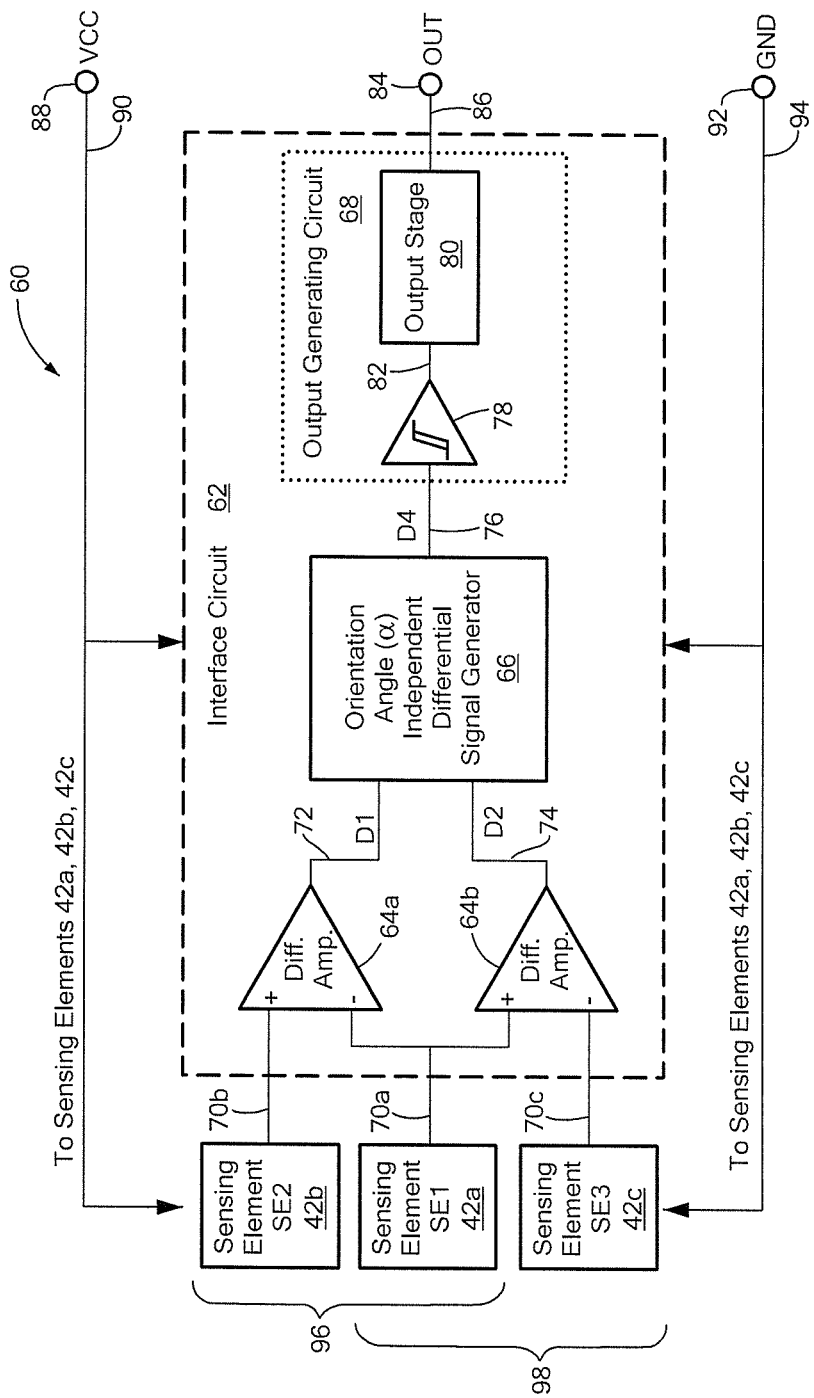
FIGS. 4A-4D are functional block diagrams of a magnetic field sensor that includes three sensing elements and a differential signal generator to generate a single differential signal based on the three sensing elements.
Figure 4B:
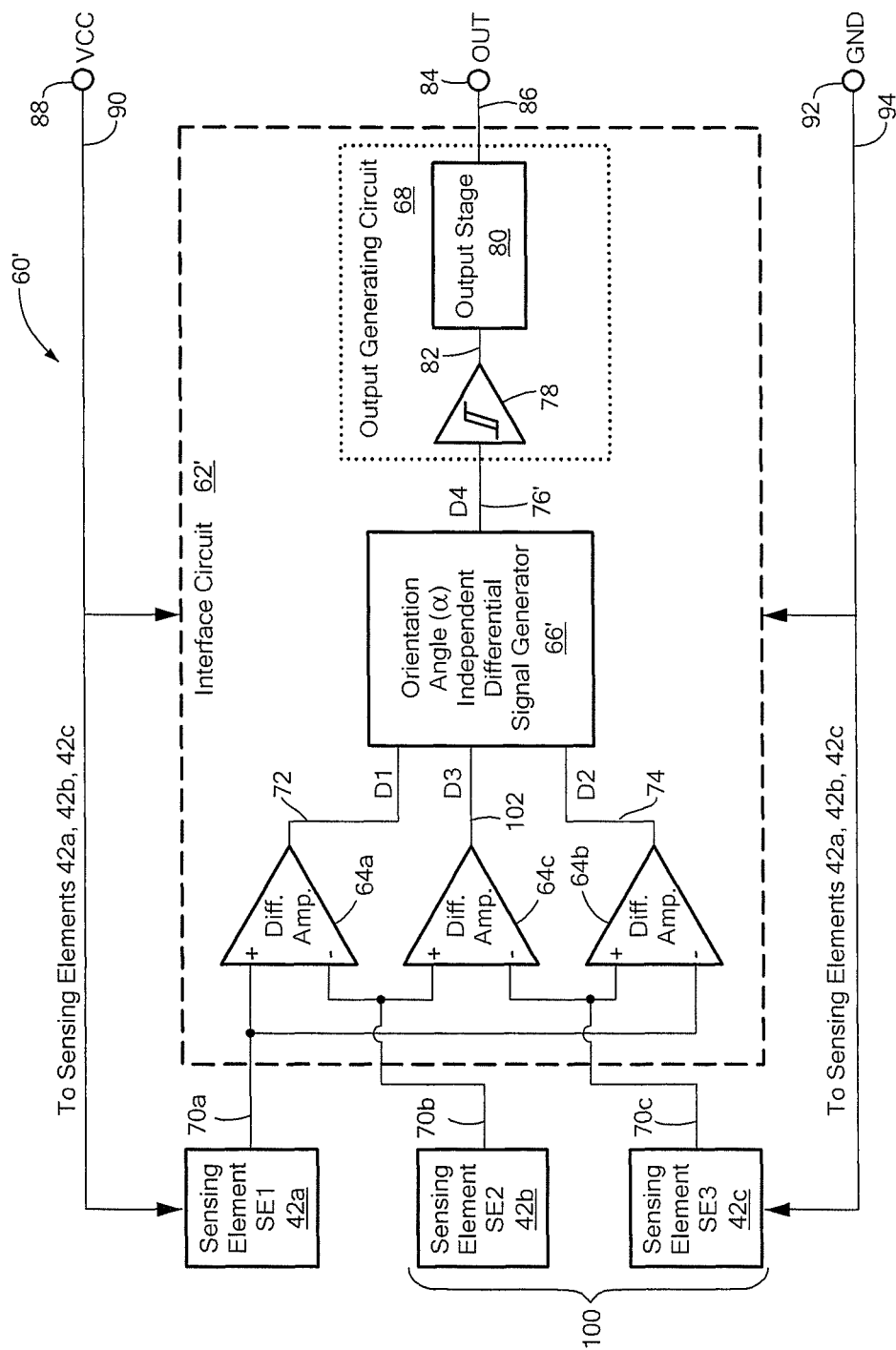

FIG. 4A shows a functional diagram of a magnetic field sensor 60 that incorporates the magnetic field sensing structure 40 depicted in FIGS. 3A-3C. The sensor 60 includes the three sensing elements 42a, 42b, 42c (again shown as sensing elements SE1, SE2, SE3). Coupled to the sensing elements 42a-42c is an interface circuit 62. The interface circuit 62 includes a first differential amplifier 64a and a second differential amplifier 64b, as well as a differential signal generator 66. The interface circuit 62 further includes an output generating circuit 68.

The sensing elements SE1 42a and SE2 42b are coupled to and provide magnetic field sensing output signals 70a and 70b, respectively, to the first differential amplifier 64a. The sensing elements SE1 42a and SE3 42c are coupled to and provide magnetic field sensing output signals 70a and 70c, respectively, to the second differential amplifier 64b. The output of each differential amplifier 64a, 64b represents only the difference in magnetic flux density between the two sensing elements to which it is coupled. The first differential amplifier 64a provides as its output a first differential signal (referred to earlier as "D1") 72 and the second differential amplifier 64b provides as its output a second differential signal (referred to earlier as "D2") 74. The differential amplifiers 64a, 64b are coupled to the differential signal generator 66. The differential signals 72 and 74 are provided as inputs to the differential signal generator 66, which produces as an output a third differential signal ("D4") 76. The differential signal generator 66 operates to generate D4 based on D1 and D2.

The amplitude of the resulting differential signal D4 is said to be independent of the orientation angle α, as mentioned above. Thus, the amplitude of the differential signal D4 is much the same as that of the differential signal that would be seen if either differential channel were aligned with the target profile's reference axis 18. Consequently, optimum performance does not depend on one or the other channel being aligned with the target profile's reference axis.

The output 76 of the differential signal generator 66 is coupled to the output generating circuit 68. The output generating circuit 68 may be implemented according to known techniques and designs to suit the needs of an application. Typically, and as illustrated, the circuit 68 includes a peak detector or comparator 78 and an output stage 80. Peak detectors track the signal provided to the detector and switch at a fixed level or at a level related to peaks of the input signal. Threshold detection applies one or more levels through which that signal must pass to induce switching. The thresholds are defined as a percentage of peak-to-peak amplitude.

The third differential signal D4 76 is provided as an input to the detector 78. The detector output, shown as output 82, is provided to the output stage 80. The output stage 80 provides to sensor output (OUT) 84 a sensor output signal 86 indicative of detected target profile transitions (such as leading and/or trailing tooth edges or magnetic pole changes). The output stage 80 may be implemented as a totem-pole push-pull or open drain, open collector output configuration. This type of configuration is a typical configuration. Devices with such an output are sometimes referred to as "three-wire" devices. Alternatively, the output stage 80 could be implemented as a current source output structure that provides two levels of current representing two digital output states of the sensor. As the output current would be provided on the supply/ground lines, the use of a current source output structure would eliminate the need for the output 84. Devices with the current output structure are sometimes referred to as "two-wire" devices. Alternatively, the output can be coded in a protocol like Inter-Integrated Circuit (I²C), Serial Peripheral Interface (SPI), Single Edge Nibble Transmission (SENT) or other protocols used in automotive, industrial or consumer applications.

An external power supply voltage can be provided to the sensor at a VCC terminal or input 88. The interface circuit 62 and sensing elements 42a-42c are coupled to the VCC input 88 via a VCC bus 90 and are connected to a ground (GND) terminal 92 through an internal GND connection 94.

As mentioned earlier, a differential channel corresponds to a location for generating a differential signal by a pair of sensing elements relative to the target profile. The differential channel contains a pair of sensing elements and other circuitry associated with that pair. In the illustrated embodiment, the sensor 60 includes a first differential channel 96 and a second differential channel 98. The first differential channel 96 includes, along with sensing elements 42a, 42b, the first differential amplifier 64a and produces the first differential signal 72. The second differential channel 98 includes the sensing elements 42a, 42c, as well as the second differential amplifier 64b, and produces the second differential signal D2 74. Each differential channel has an associated or respective sensing axis as defined by its respective pair of sensing elements. The first differential channel 96 has an associated sensing axis shown in FIGS. 3A-3C as sensing axis 44. The second differential channel 98 has an associated sensing axis shown in FIGS. 3A-3C as sensing axis 46.

Circuitry for processing the differential signal may also be considered part of the differential channel. Thus, the first differential channel 96 may include, in addition to sensing elements 42a, 42b, and differential amplifier 64a (for generating the differential signal 72), circuitry of the interface circuit 62 to process the differential signal 72 (D1). Similarly, the second differential channel 98 may include, in addition to sensing elements 42a, 42c, and differential amplifier 64b, circuitry of the interface circuit 62 to process the differential signal 74 (D2). In the implementation shown in FIG. 4A, units 66 and 68 are shared by the first and second differential channels, i.e., first differential channel 96 and second differential channel 98.

Other aspects of the magnetic field sensor 60, not shown, may be implemented according to known techniques and designs. The implementation can be analog, digital or mixed signal. It will be understood that interface circuit 62 may contain various other circuits that operate collectively to generate a sensor output from the magnetic field signals of the sensing elements. For example, an amplifier and other circuitry may be coupled between each sensing element and its corresponding differential amplifier to amplify the magnetic field and, optionally, to implement other features, such as dynamic offset cancellation (i.e., chopper stabilization), automatic gain control (AGC) and offset adjustment. Alternatively, or in addition, such features may be provided elsewhere, e.g., between the differential amplifier and the differential signal generator (as illustrated in FIG. 4D).

The sensor 60 may be provided in the form of an integrated circuit (IC) containing a semiconductor substrate on which the various circuit elements are formed. The IC would have at least one pin to correspond to each of: the VCC input or terminal 88, GND terminal 92 and, depending on the output stage implementation, the output (OUT) 84. It will be appreciated that the functionality of the IC, that is, the circuit elements contained within it, can be varied to suit a particular application. The sensing elements 42a-42c and interface circuit 62 can be provided on the same die or on separate dies.

FIG. 4B shows a sensor having an implementation similar to that of sensor 60 of FIG. 4A. The sensor in FIG. 4B, shown as sensor 60', differs from the sensor 60 of FIG. 4A in that the sensor 60' makes use of the third sensing element pair 42b, 42c (as illustrated in FIGS. 3D-3F) in addition to the sensing pairs 42a, 42b and 42a, 42c from FIG. 4A. In the illustrated embodiment of FIG. 4B, the sensor 60' includes a third differential channel 100 (in addition to the first differential channel 96 and a second differential channel 98, shown in FIG. 4A and omitted from FIG. 4B for simplification). The third differential channel 100 includes, along with sensing elements 42b, 42c, a third differential amplifier 64c and produces the third differential signal referred to earlier as "D3" and indicated by reference numeral 102. The third differential channel 100 has an associated sensing axis shown in FIGS. 3D-3F as sensing axis 58.

The differential amplifiers 64a, 64b, 64c are coupled to the differential signal generator, shown here as differential signal generator 66'. The differential signals 72, 74 and 102 are provided as inputs to the differential signal generator 66', which produces as an output a fourth differential signal ("D4") 76'. The differential signal generator 66' operates to generate D4 76' based on D1, D2 and D3. The amplitude of the resulting differential signal D4 76' is said to be independent of the orientation angle α, as was discussed above in connection with differential signal D4 76 from FG. 4A.

The output 76' of the differential signal generator 66' is coupled to the output generating circuit 68. Other details of FIG. 4B are the same as described for FIG. 4A. The differential signal D4 76' is provided as an input to the detector 78. The detector output, shown as output 82, is provided to the output stage 80. The output stage 80 provides to sensor output (OUT) 84 a sensor output signal 86 indicative of detected target profile transitions (such as leading and/or trailing tooth edges or magnetic pole changes).

Figure 4C:
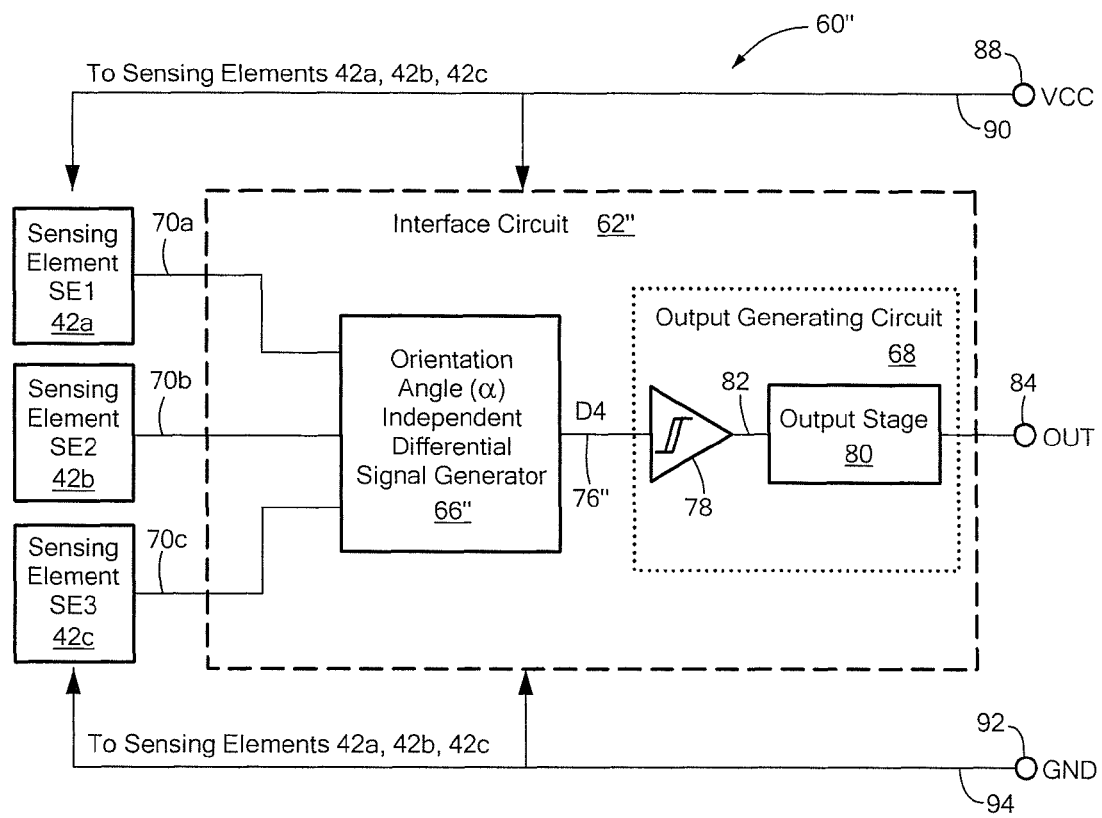
Figure 4D:
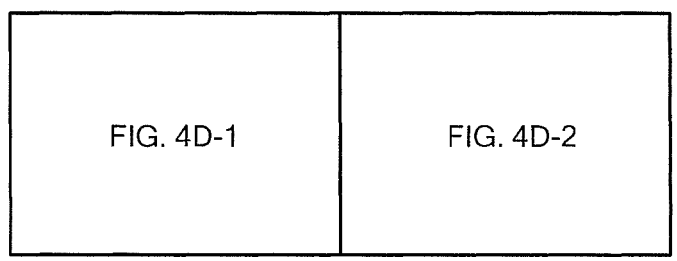
Figures 1, 4D:
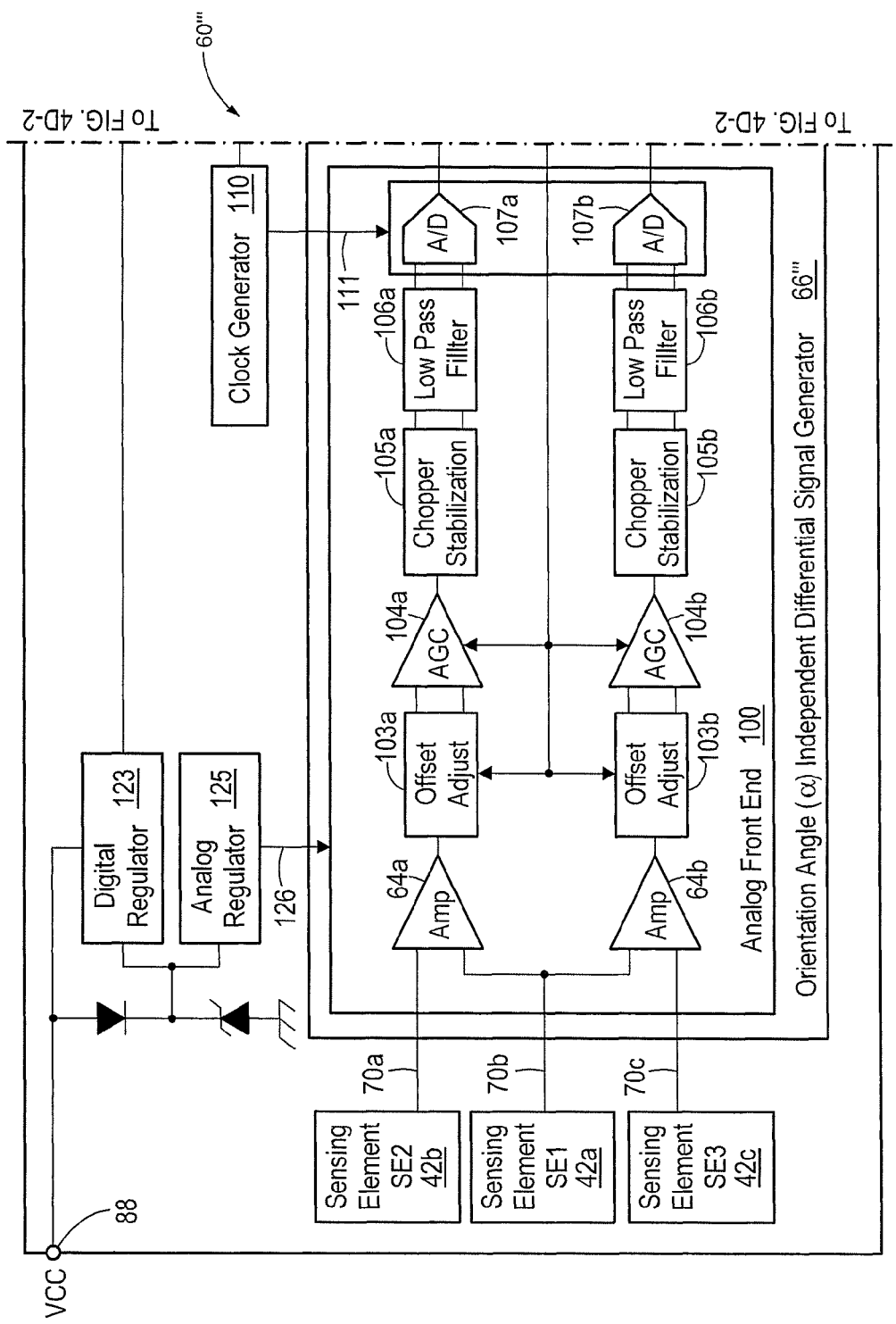
Figures 2, 4D:
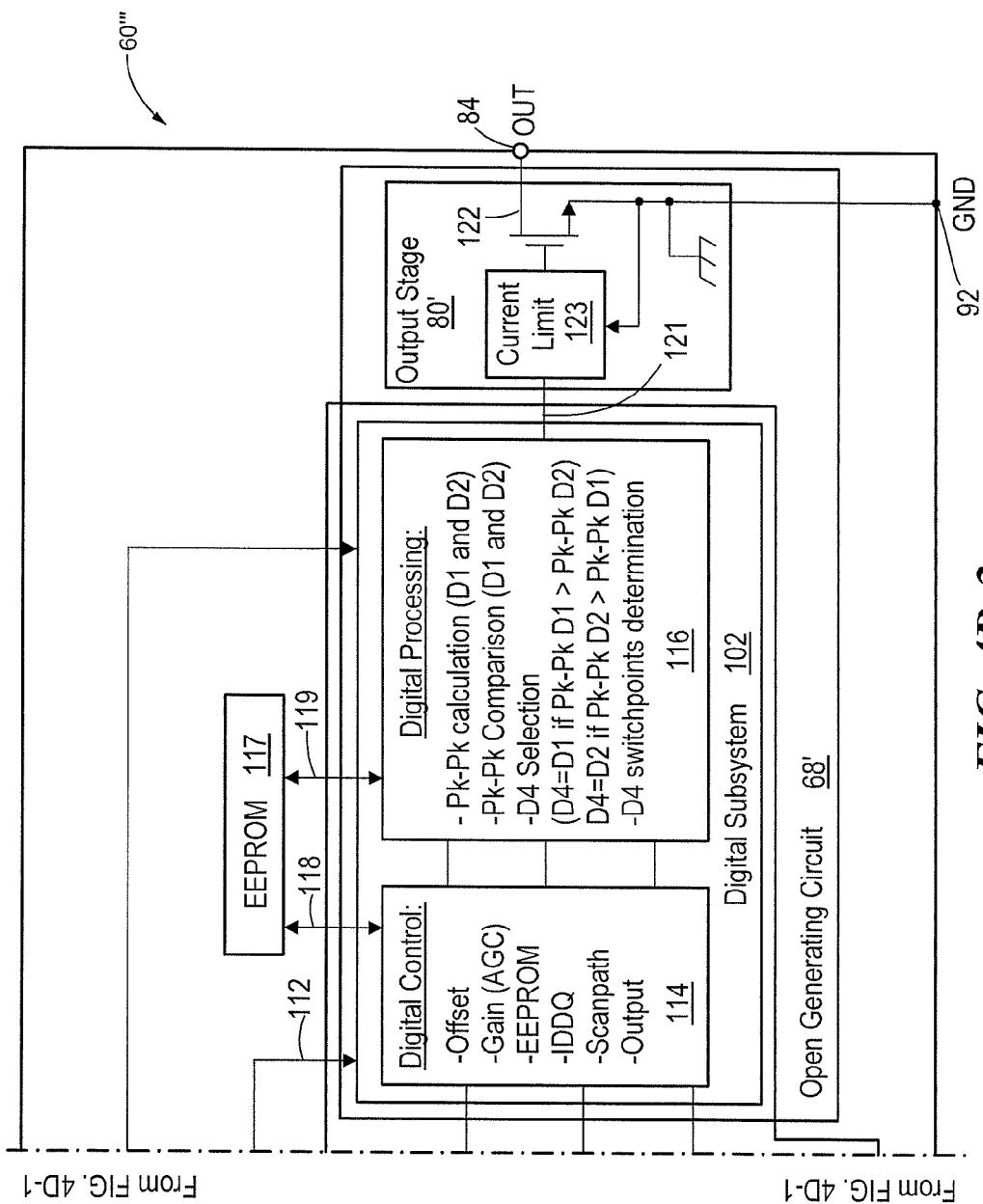

In yet another alternative implementation, and referring now to FIG. 4C, the sensor shown in the figure as sensor 60" includes an interface 62". The interface 62" receives as inputs, signals 70a-70c, from respective sensing elements 42a-42c. The interface 62" includes an orientation angle independent differential signal generator 66" to produce the orientation angle independent differential signal D4, shown here as D4 76". Unlike the differential signal generator 66 (from FIG. 4A) and 66' (from FIG. 4B), the differential signal generator 66" includes internally the differential amplifiers 64 (from FIGS. 4A-4B) as well as functionality to combine mathematically the outputs of those differential amplifiers 64 (i.e., the differential signals D1, D2, D3) and/or the sensing element outputs 70a, 70b, 70c. It further includes signal processing capability, coupled to the combinations functionality, to normalize that combined signal so that it is truly independent of the orientation angle. The signal processing capability can include at least an AGC block. With the inclusion of programmable memory (e.g., EEPROM) and microprocessor, the differential signal generator 66" can be configured to perform different combinations as well as types of signal processing. Other features are as previously described with respect to FIGS. 4A and 4B.

FIG. 4D shows yet another example embodiment of a sensor, shown as sensor 60''', that incorporates a three-SE structure like the one shown in FIGS. 3A-3C. This particular implementation features a digital subsystem to enable processing in the digital domain. Like the sensors shown in FIGS. 4A-4C, sensor 60''' also includes sensing elements 42a-42c. The sensor 60''' has the same high-level functional blocks as sensor 60" from FIG. 4C, including an orientation angle independent differential signal generator indicated by reference numeral 66''' and an output generating circuit indicated by reference numeral 68'. The differential signal generator 66''' includes an analog front end 100 and a digital subsystem 102. The analog front end 100 includes the two differential amplifiers 64a, 64b (which were also shown in FIGS. 4A-4B). Shown in this particular implementation are various signal conditioning circuits, including offset adjustment ("offset adjust") circuits 103a, 103b, automatic gain control (AGC) circuits 104a, 104b, chopper stabilization circuits 105a, 105b, low pass filters 106a, 106b and analog-to-digital converters (A/Ds) 107a, 107b (collectively, A/D 108). A clock generator 110 provides timing signals to the A/D 108 (via clock line 111) and digital subsystem 102 (via clock line 112). Circuits 64a, 103a, 104a, 105a, 106a and 107a are part of the first differential channel associated with the sensing element pair 42a, 42b. Circuits 64b, 103b, 104b, 105b, 106b and 107b are part of the second differential channel associated with the sensing element pair 42a, 42c.

Still referring to FIG. 4D, the output generating circuit 68' includes output stage 80'and the digital subsystem 102. Thus, blocks 66''' and 68' share the digital subsystem 102. In the illustrated embodiment, the digital subsystem 102 includes a control portion ("Digital Control") 114 and a processing portion ("Digital Processing") 116. The control portion 114 and processing portion 116 are coupled to a nonvolative memory 117, e.g., an EEPROM, as shown, via memory bus lines 118 and 119, respectively. The EEPROM 117 is used to program functions of the control and processing portions 114, 116, that is, store program code to be executed by the processing portion 116 and operating parameters. For example, the control portion 114 can be configured to control the A/Ds, the AGCs and offset adjust circuits via control lines 120, as well as set or control test features, e.g., of test modes like Quiescent supply current test (IDDQ) and boundary scan scanpath. The digital processing portion 116 can be programmed to perform the D4 determination, e.g., according to a process described with reference to FIG. 9A, or other processes, as well as D4 switch-point determination. The output of the digital subsystem, output 121, is provided to the output stage 80'. The output stage 80' is shown as being implemented with a transistor, e.g., MOSFET 122, and a current limit circuit 123 connected between the MOSFET 122 and the digital subsystem output 121.

The device external connections/terminals are the same as in the previous sensor figures, FIGS. 4A-4C. That is, VCC terminal 88 provides connection to the supply voltage, GND terminal 92 allows connection to ground and OUT terminal 84 allows the sensor output to be provided to external devices that will use that output. Also shown in this figure are internal voltage regulators including a digital regulator 123 that provides a regulated supply voltage to the digital system 102 (via line 124) and an analog regulator 125 that provides a regulated supply voltage to the analog front end 100 (via line 126).

Although not shown in FIGS. 4A-4D, it will be appreciated that circuitry to support additional channels associated with sensing element pairs 42b, 42d and 42c, 42e as shown in FIG. 3G, along with an additional output stage to support direction detection (where the existing output stage is used to provide speed information), can be included in the sensor as well.

The operation of the sensor (e.g., sensor 60 from FIG. 4A, sensor 60' from FIG. 4B, sensor 60" from FIG. 4C or sensor 60''' from FIG. 4D) to provide an output signal indicative of target movement is designed to be largely insensitive to the angle at which the sensor is positioned (at installation time) and/or maintained (post-installation) relative to the target, e.g., when the sensor installation involves movement of the sensor about an axis (such as axis 25, shown in FIG. 1B) that is orthogonal to the face of the target profile. More specifically, the sensor can operate to provide the same (or much the same) differential signal D4 regardless of the orientation angle α of the sensor's first sensing axis 44 relative to the target profile's reference axis 18 (shown in FIG. 1A). Such tolerance of the orientation angle can greatly simplify sensor installation and maintenance, since manufacturing procedures and/or packaging designs required to meet the sensor-to-target alignment specification are unnecessary.

In some applications, it may be advantageous to have a symmetrical structure relative to the center of the sensor die. This can be achieved by using an even number of sensing elements, for example, four, in a symmetrical layout as illustrated in FIGS. 5A-5C.

Figure 5B:
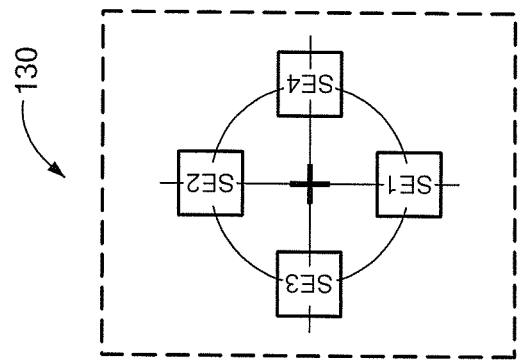
FIGS. 5A-5C are pictorial representations of an exemplary magnetic field sensing structure that includes four sensing elements configured for orientation independent, differential sensing.
Figure 5C:
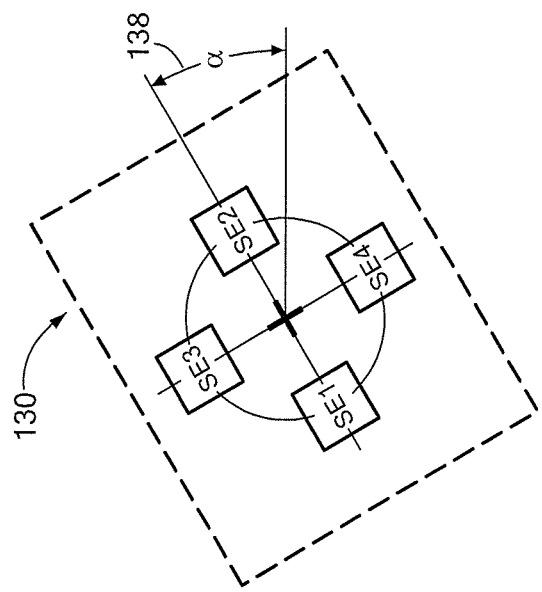
Figure 5A:
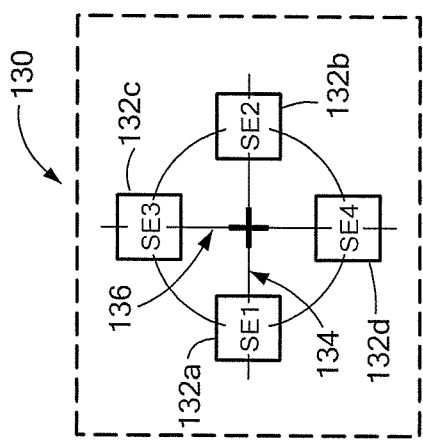

In an alternative exemplary embodiment, and referring to FIGS. 5A-5C, an arrangement based on the use of four sensing elements is shown. As shown in FIGS. 5A-5C, a magnetic field sensing structure 130 has a configuration of four sensing elements 132a, 132b, 132c and 132d (also labeled "SE1", "SE2", "SE3" and "SE4", respectively) for use in a differential magnetic field sensor. The sensing elements are spaced apart by some fixed distance. Each pair of sensing elements, sensing elements 132a, 132b (first pair) and sensing elements 132c, 132d (second pair), is used to generate a differential signal responsive to change in magnetic field strength at a location relative to a target profile (like target profile 14 of FIG. 1A, FIGS. 2A-2B).

Still referring to FIGS. 5A-5C, a first sensing axis 134 is defined by the arrangement of the sensing elements 132a, 132b and a second sensing axis 136 is defined by the arrangement of the sensing elements 132c, 132d. Thus, in the illustrated example, the four sensing elements are spatially arranged, for example, on the surface of a sensor die (the outline of which is indicated by dashed lines), to define the two sensing axes 134, 136. In this embodiment, the sensing elements are arranged so that the two sensing axes 134, 136 are not aligned with each other in the plane of the die surface and intersect each other. Preferably, they are at an angle of about 90 degrees relative to each other. The element-to-element spacing of the sensing elements in each pair is preferably the same (or approximately the same), but could be different.

Referring now to FIG. 5A, when the first sensing axis 134 is aligned with a target profile (that is, and retelling back to FIG. 1A, it aligns with the target profile's reference axis 18), a differential signal "D1" generated by the first pair 132a, 132b will have an amplitude that is maximal ("$D1_{max}$") and a differential signal "D2" generated by the second pair 132c, 132d will be zero ("$D2_{zero}$"). Referring to FIG. 5B, when the first sensing axis 134 is positioned at a 90 degree angle relative to the target profile's reference axis, the signal amplitude for the first differential signal D1 will be zero ("$D1_{zero}$") and signal amplitude for the second differential signal will be maximal ("$D2_{max}$"). Referring to FIG. 5C, for a random orientation angle α 138 between the first sensing axis 134 and the target profile's reference axis, the signal amplitude for the first differential signal D1 and the second differential signal D2 will vary with the change in angle. A differential signal whose amplitude is independent of the orientation angle α 138 can be determined from D1 and D2, or more generally from any mathematical combination of SE1, SE2, SE3 and SE4.

Figure 6:
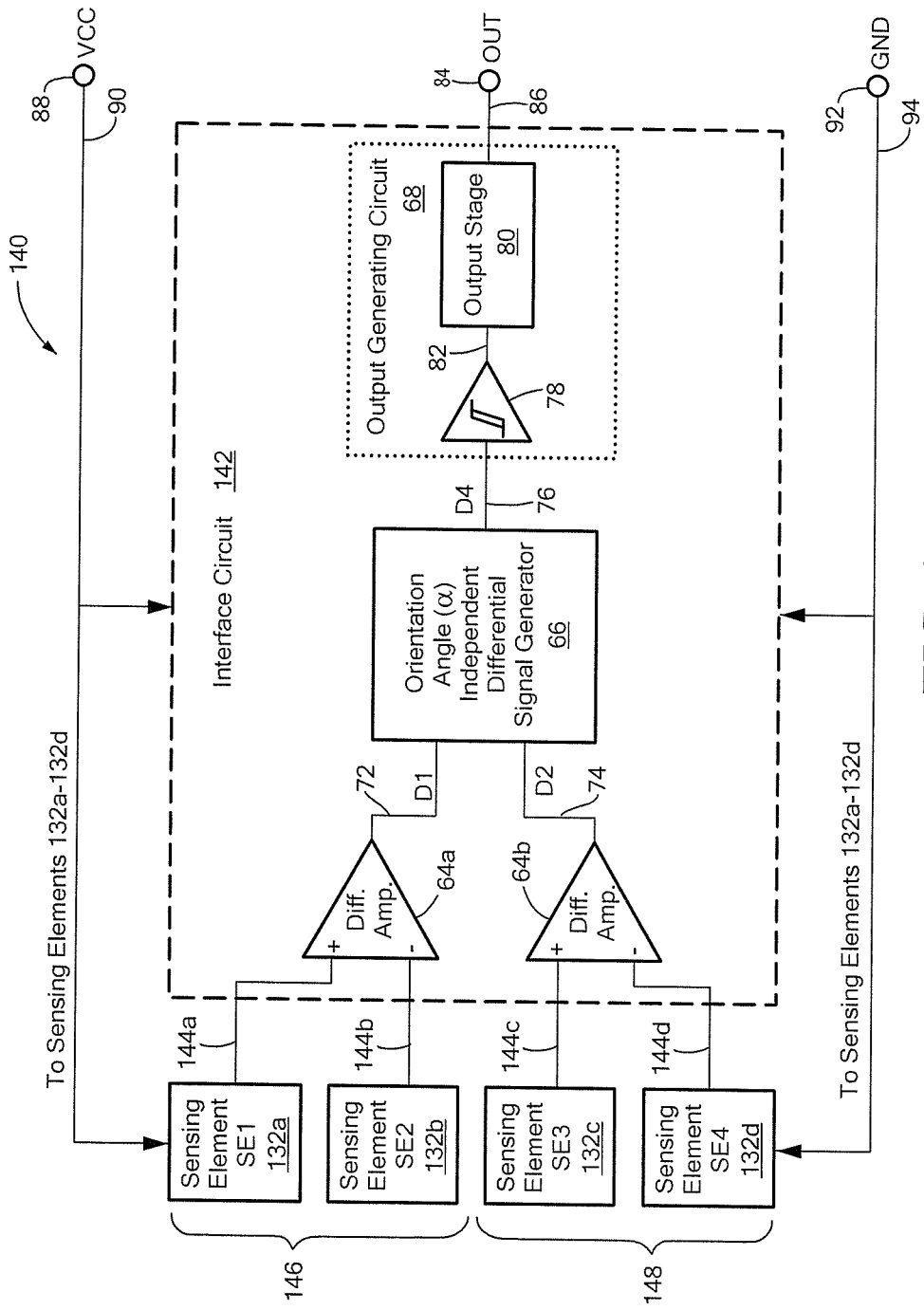
FIG. 6 is a functional block diagram of a magnetic field sensor that includes four sensing elements and a differential signal generator to use differential signals from differential channels formed by pairs of the sensing elements to generate a single differential signal.

FIG. 6 shows a functional diagram of a magnetic field sensor 140 that includes the magnetic field sensing structure depicted in FIGS. 5A-5C. The sensor 140 includes the four sensing elements 132a-132d (again shown as sensing elements SE1, SE2, SE3, SE4). The functionality of the interface circuit, shown here as interface 142, is much the same as that of interface circuit 62 (from FIG. 4A). Like elements are identified by like reference numeral. The only difference is that interface circuit 142 receives four separate signals from the sensing elements. Thus, differential amplifier 64a receives as inputs a signal 144a from sensing element 132a and a signal 144b from sensing element 132b, and differential amplifier 64b receives as inputs a signal 144c from sensing element 132c and a signal 144d from sensing element 132d.

In the illustrated embodiment of FIG. 6, the sensor 140 includes a first differential channel 146 and a second differential channel 148. The first differential channel 146 includes, along with sensing elements 132a, 132b, the first differential amplifier 64a and produces the first differential signal D1 72. The second differential channel 148 includes the sensing elements 132c, 132d, as well as the second differential amplifier 64b, and produces the second differential signal D2 74. Each differential channel has an associated or respective sensing axis as defined by its respective pair of sensing elements. The first differential channel 146 has an associated sensing axis shown in FIGS. 5A-5C as sensing axis 134. The second differential channel 148 has an associated sensing axis shown in FIGS. 5A-5C as sensing axis 136.

The first differential channel 146 may include, in addition to sensing elements 132a, 132b, and differential amplifier 64a for generating the differential signal 72, circuitry of the interface circuit 142 to process the differential signal 72. Similarly, the second differential channel 148 may include, in addition to sensing elements 132c, 132d, and differential amplifier 64b for generating the differential signal 74, circuitry of the interface circuit 142 to process the differential signal 74. It will be appreciated that the four SE design shown in FIG. 6 can be modified to combine the differential amplifiers 64 and the differential signal generator 66 (similar to what was described with respect to the embodiment shown in FIG. 4C for a three SE design).

In general, for any embodiment of three or more sensing elements (including the exemplary embodiments depicted in FIGS. 3A-G, FIG. 4A-4D, FIGS. 5A-5C and FIG. 6), the element-to-element spacing of sensing elements for the differential channels does not need to be identical, and the angle between sensing axes associated with the channels can be different from 90 degrees. If required, more sensing elements can be added to the magnetic sensing structure. The total number of sensing elements, a minimum of three being required, may be an even number or an odd number. Instead of using three sensing elements, as shown in FIGS. 3A-F and FIG. 4A-4D, or four sensing elements as shown in FIGS. 5A-C and FIG. 6, the magnetic sensing structure could be implemented with sensing elements arranged in a ring configuration. Alternatively, the entire ring could be a sensing area.

It will be understood that the sensing element may be a Hall-effect element (or Hall plate) or take a form other than that of a Hall-effect element, such as a magnetoresistance (MR) element. An MR element may be made from any type of MR device, including, but not limited to: an anisotropic magnetoresistance (AMR) device; a giant magnetoresistance (GMR) device; and a tunneling magnetoresistance (TMR) device. The sensing element may include a single element or, alternatively, may include two or more elements arranged in various configurations, e.g., a half bridge or full (Wheatstone) bridge.

The sensing element may be a device made of a IV type semiconductor material such as Silicon (Si) or Germanium (Ge), or a III-V type semiconductor material like Gallium-Arsenide (GaAs) or an Indium compound, e.g., Indium-Antimonide (InSb). If separate sensing dies are used, the sensing dies could be made of different technologies, for example, GaAs, Ge, AMR, GMR, TMR, and others.

Figure 7A:
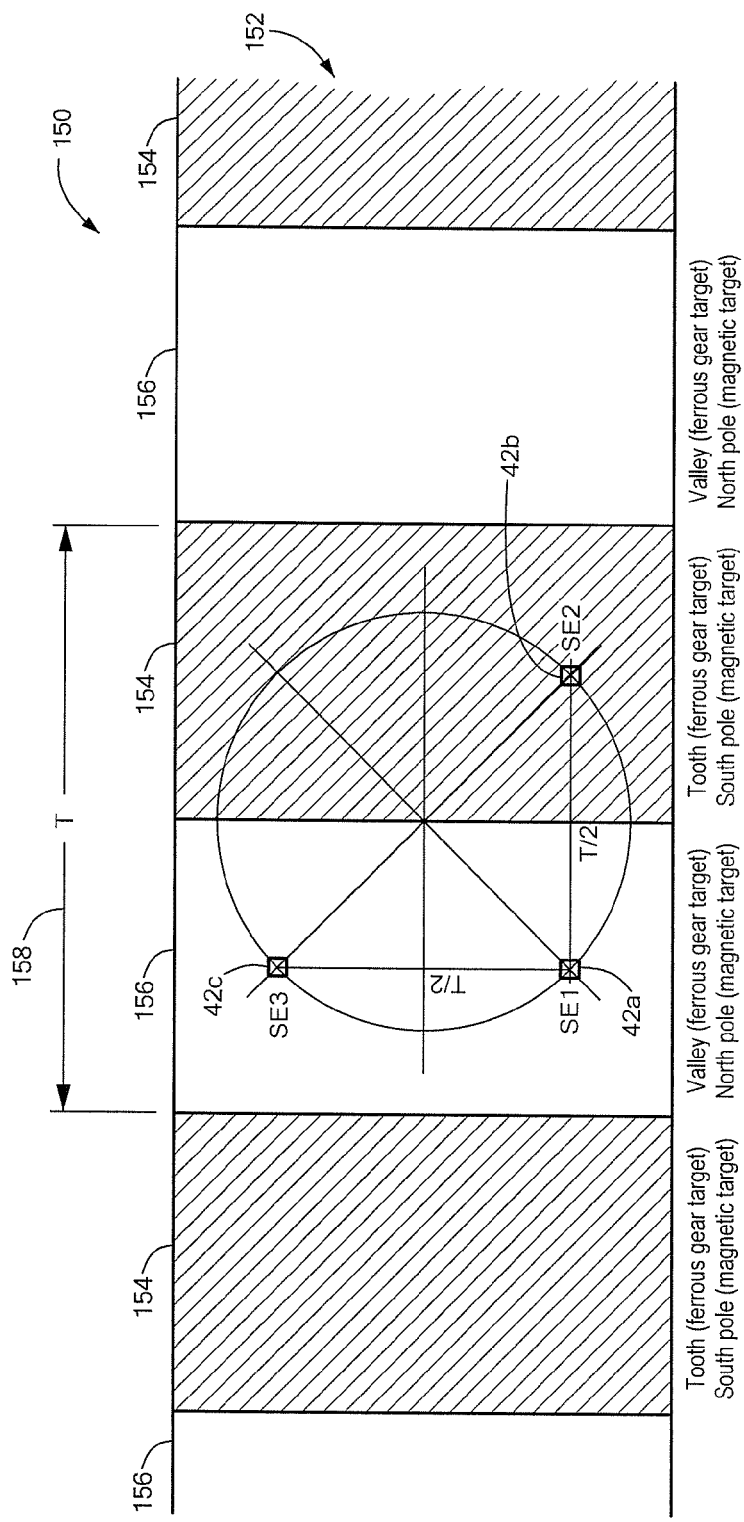
FIGS. 7A-7F illustrate differential signals obtained using sensing element pairs for various orientation angles including 0, 22.5 and 45 degrees.
Figure 7B:
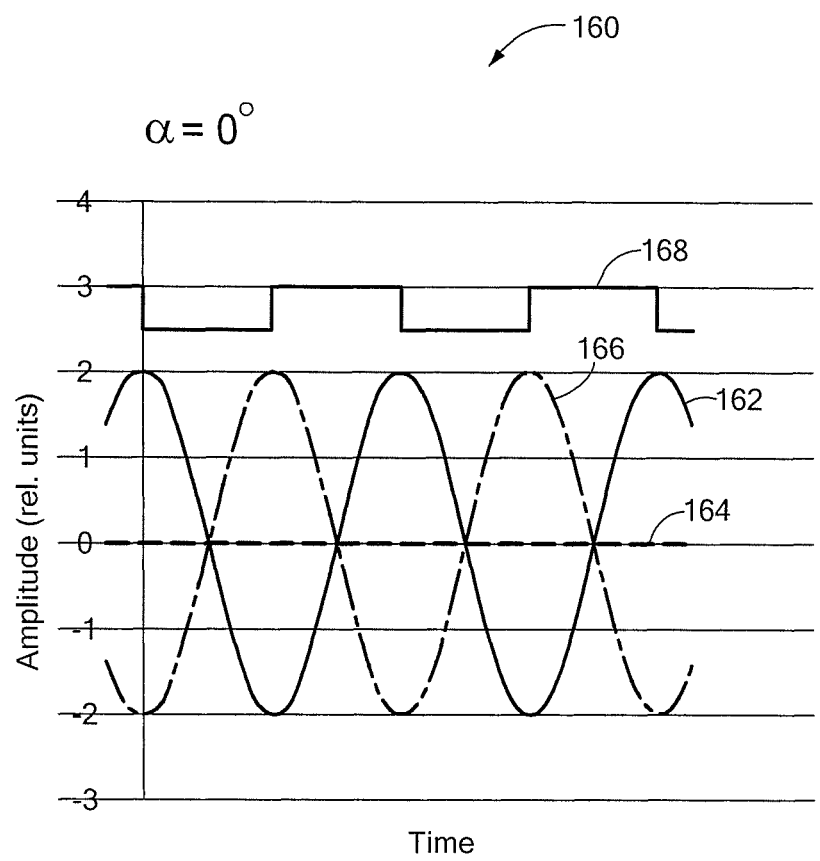
Figure 7C:
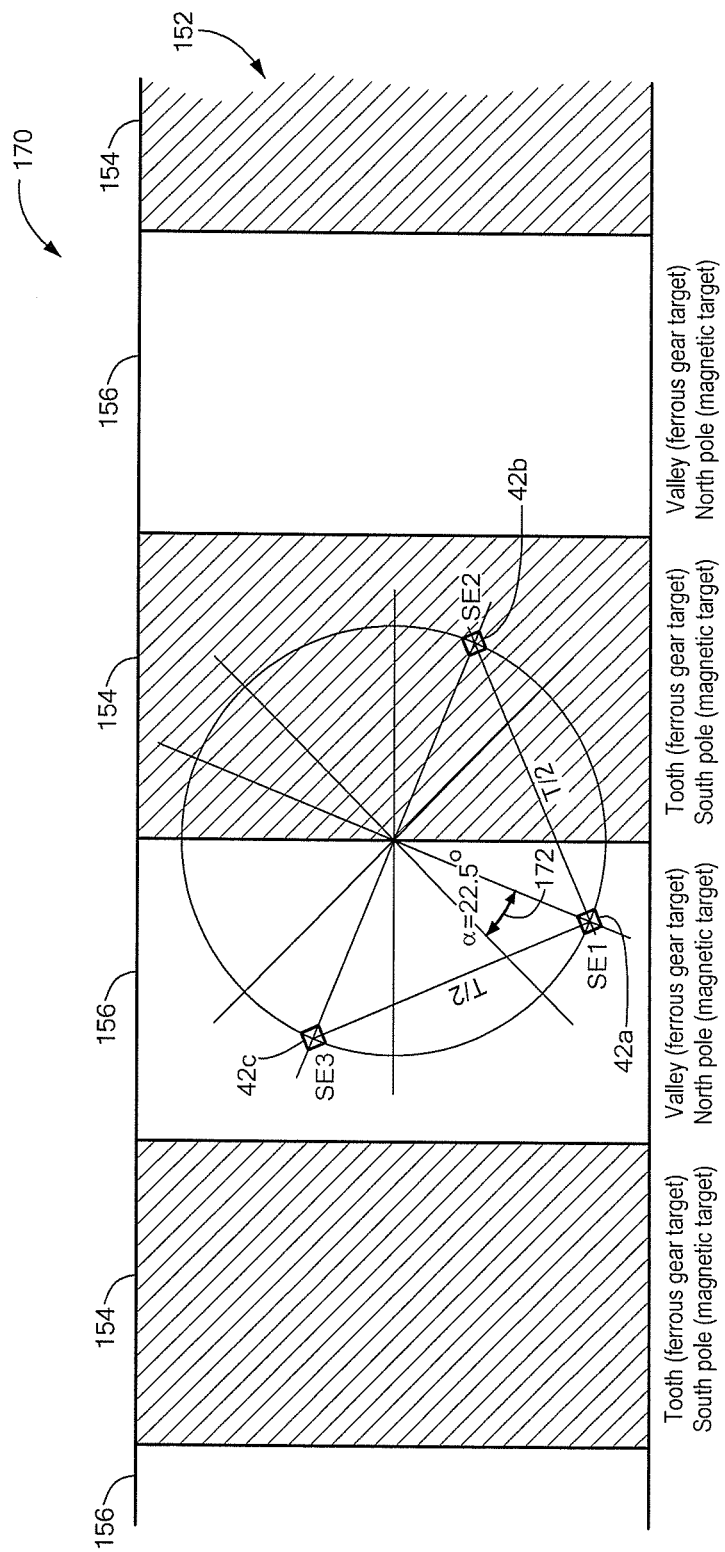
Figure 7D:
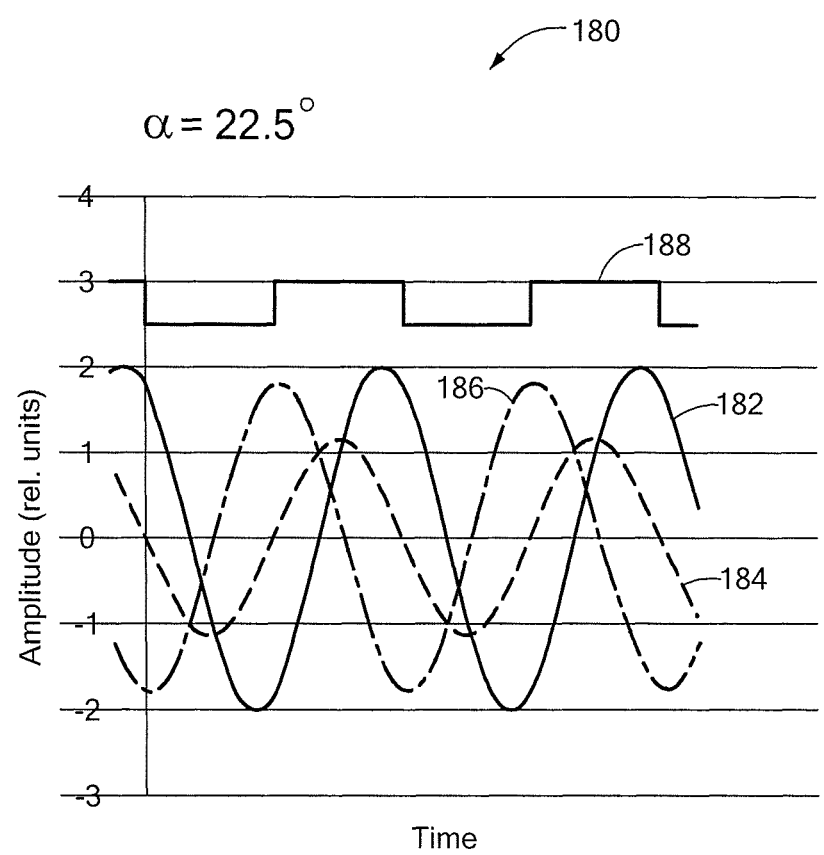
Figure 7E:
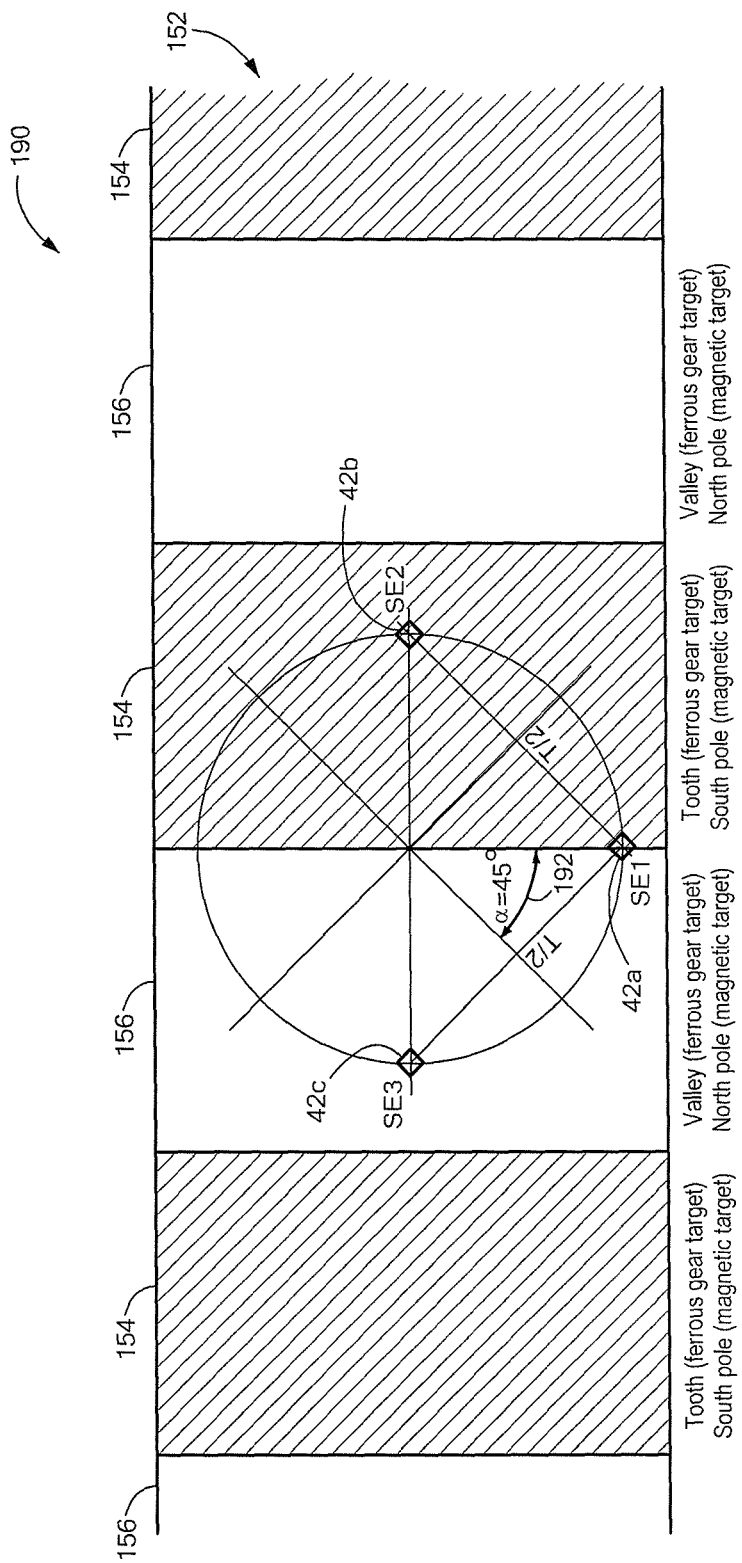
Figure 7F:
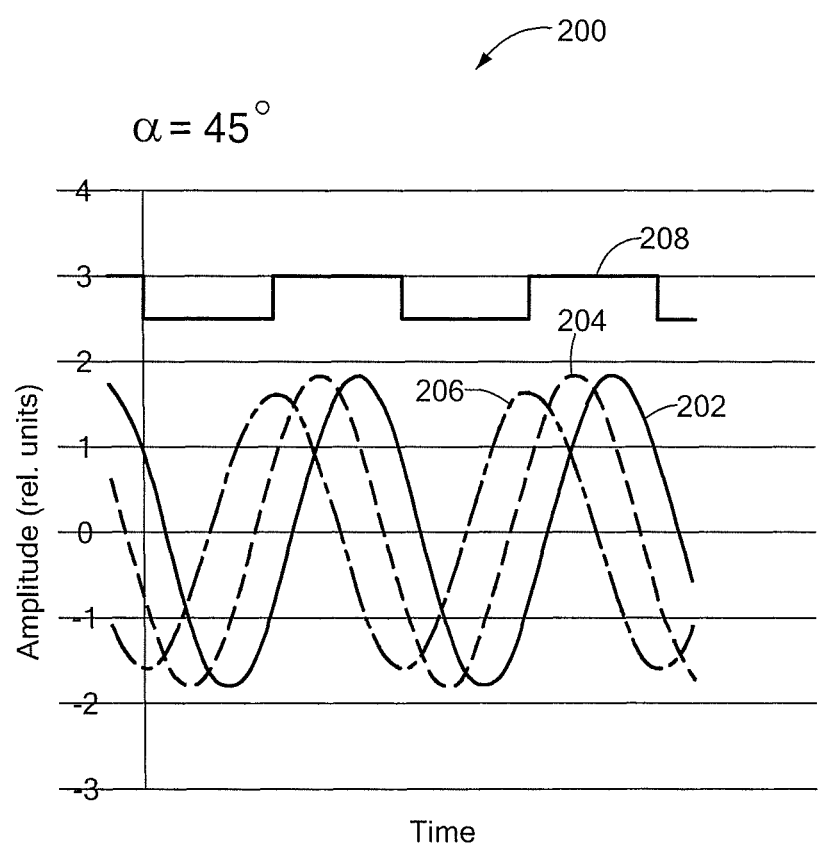

FIGS. 7A-7F illustrate the impact of orientation angle α on differential signal amplitude for a three SE arrangement. FIGS. 7A-7B correspond to an orientation angle α of zero degrees. FIGS. 7C-7D correspond to an orientation angle α of 22.5 degrees. FIGS. 7E-7F correspond to an orientation angle α of 45 degrees. For the sake of clarity, it is assumed that the target produces a sinusoidal magnetic profile. FIGS. 7B, 7D and 7F are graphs of amplitude versus time, with amplitude being given in relative units. It will be seen from FIGS. 7B, 7D and 7F that differential signal amplitudes and phases change with increasing orientation angle.

FIG. 7A shows a top down view of a sensing arrangement 150 in which the three sensing elements SE1 42a, SE2 42b and SE3 42c (in a sensor package, not shown) are positioned in proximity to a target 152 having alternating poles (for a magnetic target) or ferrous gear target features, e.g., teeth/valleys. The reference position of the sensing elements is for an orientation angle α of zero degrees. In this figure, the raised portions or South poles are indicated by reference numeral 154 whereas the recessed portions or North poles are indicated by reference numeral 156. The spacing between SE1 42a and SE2 42b and the spacing between SE1 42a and SE3 42c corresponds to a distance T/2, where T (indicated by reference numeral 158) is the period of the target. FIG. 7B shows a graph 160 of amplitude versus time for differential signals D1, D2 and D3. The waveforms for differential signals D1, D2 and D3 are indicated by reference numerals 162, 164 and 166, respectively. The differential signals are produced by rotating the target in front of the sensing elements. Also shown is the target profile, indicated by reference numeral 168. It can be seen that the signal amplitudes of differential signals D1 162 and D3 166 are of equal, maximal magnitude and opposite polarity. It can also be seen that the signal peaks of differential signals D1 and D3 correspond to the transitions in the target's features (e.g., North pole to South pole). Also, as shown in FIG. 7B, for an orientation angle α of zero degrees, the resulting amplitude of the differential signal D2 164 (produced by the channel formed by SE1 and SE3) is always zero.

FIG. 7C shows a sensing arrangement 170 in which the reference position of the sensing elements is for an orientation angle α of 22.5 degrees 172. Other details are as shown in FIG. 7A. FIG. 7D shows a graph 180 of the differential signals D1, D2 and D3 for the reference position shown in FIG. 7C, that is, for an orientation angle α of 22.5 degrees. The waveforms for the differential signals D1, D2 and D3 are indicated by reference numerals 182, 184 and 186, respectively. The target profile is indicated here by reference numeral 188. It can be seen in FIG. 7D that all of the differential signals now have a non-zero amplitude. The amplitude of D3 is slightly smaller than it was for an orientation angle of zero degrees (as was shown in FIG. 7B) and the amplitude of D2 is much smaller than the amplitudes of D1 and D3.

FIG. 7E shows an example sensing arrangement 190 in which the reference position of the sensing elements is for an orientation angle α of 45 degrees 192. Other details are as shown in FIG. 7A (and 7C). FIG. 7F shows a graph 200 of the differential signals D1, D2 and D3 for the reference position shown in FIG. 7E. The waveforms for differential signals D1, D2 and D3 are indicated by reference numerals 202, 204 and 206, respectively. Also shown is the target profile, indicated by reference numeral 208. Here the amplitudes of D1 and D2 are equal (but smaller than the amplitudes for D1 and D3 for a zero degree angle, as shown in FIG. 7B) and the amplitude of D3 is smaller than those of D1 and D2. Referring back to FIG. 7B in conjunction with FIG. 7E, it can be seen that the phases between the differential signals have also changed with change in orientation angle.

Figure 8A:
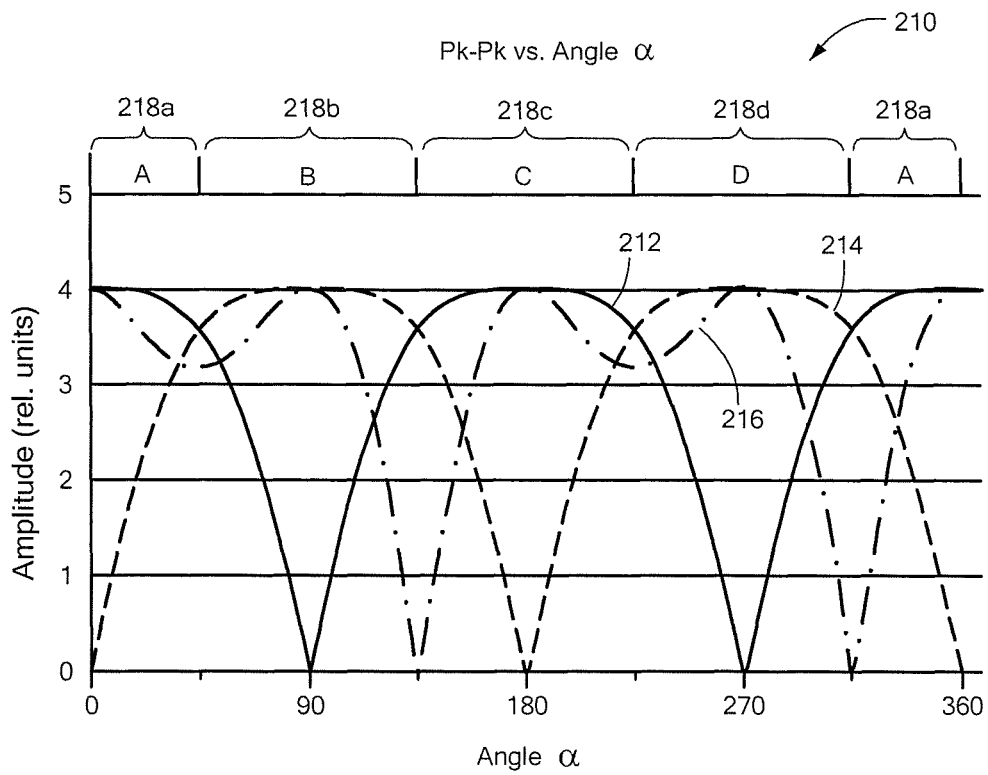
FIGS. 8A-8B are graphs that show differential signal amplitude versus orientation angle.

FIG. 8A shows a graph 210 of the peak-to-peak amplitudes of the differential signals D1, D2 and D3 (for one embodiment) as a function of the orientation angle α. The peak-to-peak amplitudes are given in relative units. The peak-to-peak amplitude of D1 is indicated by reference numeral 212, the peak-to-peak amplitude of D2 is indicated by reference numeral 214 and the peak-to-peak amplitude of D3 is indicated by reference numeral 216. In one possible embodiment, as will be described with reference to FIG. 9A, the differential signal D4 may be selected as either D1 or D2 based on the orientation angle α. Such a selection will produce a differential signal D4 having a variation in peak-to-peak amplitude (with increase in orientation angle) that is limited to approximately 1% of the total peak-to-peak amplitude in certain angle ranges, e.g., 0 degrees to 22.5 degrees, and is limited to approximately 10% of the total peak-to-peak amplitude in other angle ranges, e.g., 22.5 degrees to 67.5 degrees. Thus, D1 can be selected for an angle range (or "zone") of 0 to 45 degrees and 315 to 360 degrees ("zone A") 218a and 135 to 225 degrees ("zone C") 218c. The differential signal D2 can be selected for the other ranges of angles, that is, 45 to 135 degrees ("zone B") 218b and 225 to 315 degrees ("zone D") 218d. In the illustrated example, it can be seen that within each of those angle ranges or zones, the differential signal D4 is orientation angle independent (with variation limited to approximately 10% in the first and fourth quarters of the zone and variation limited to approximately 1% in the second and third quarters of the zone).

Figure 8B:
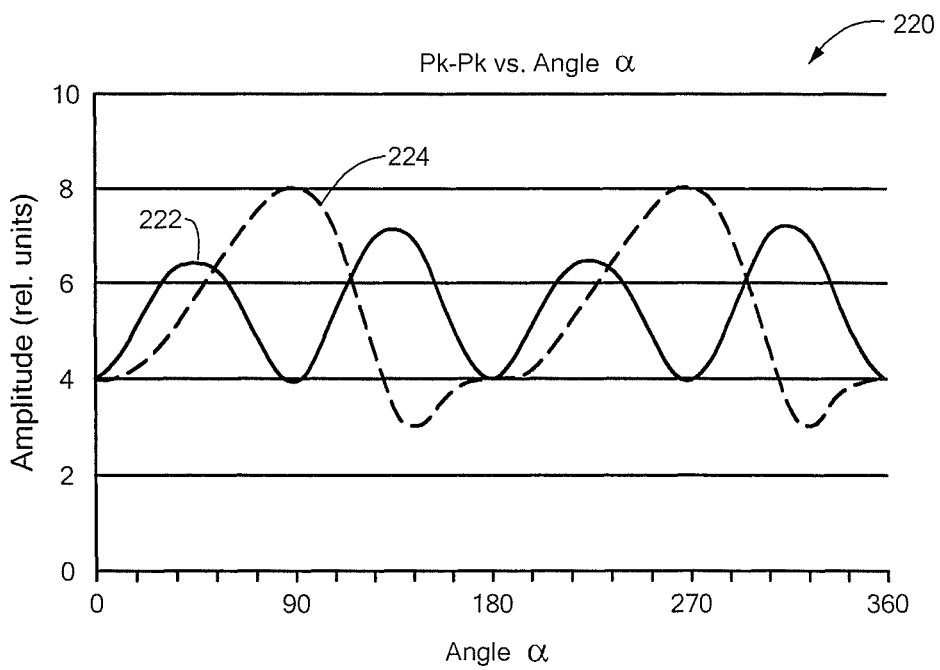

FIG. 8B shows a graph 220 for peak-to-peak amplitudes of signals resulting from a particular mathematical combination of differential signals D1, D2 and D3 as a function of the orientation angle α. The peak-to-peak amplitudes are given in relative units. The graph 220 shows only two of the many possible different mathematical combinations that can be defined between the differential signals D1, D2, D3, or more generally sensing elements SE1, SE2 and SE3. Illustrated are the peak-to-peak amplitude for the differential signal "D4" based on a mathematical combination of the differential signals D1 and D2, "D1+D2", indicated by reference numeral 222, and the peak-to-peak amplitude for a differential signal based on a mathematical combination of D2 and D3, "D2+D3", indicated by reference numeral 224.

Referring to FIG. 9A, an exemplary operation of the D4 signal generator, operation 230, begins (at block 232) with the receipt of signals D1 and D2. The operation determines the amplitudes of D1 and D2 (block 234). To obtain a positive and negative peak for each signal, values for D1 and D2 are acquired over at least one period. The operation compares the amplitudes of D1 and D2, for example, by determining if the absolute value of the D1 signal amplitude is greater than the absolute value of the D2 signal amplitude (block 236). If that comparison yields a true result, then D1 is selected for use as D4 (block 238). Otherwise, D2 is selected for use as D4 (block 240). The operation ends (at block 242) by providing the result as D4.

Referring back to the graph shown in FIG. 8A, the differential signal D1 would be selected in zones A and C, and the differential signal D2 would be selected in zones B and D. By choosing between the signals in this manner, the signal amplitude of the differential signal that is used by the sensor (that is, the signal chosen as D4) is never allowed to fall below a certain threshold (thereby minimizing the amount by which the signal amplitude can vary with orientation angle). In the example shown in FIG. 8A, the amplitude never goes below ~3.6 (the absolute value of both signals' amplitudes, in relative units, at the zone transitions, that is, at 45 degrees, 135 degrees, 225 degrees and 315 degrees). The number of zones could be increased by increasing the number of sensing element pairs that are used. More zones would further limit the amplitude range in which the signal amplitudes of the differential signals are orientation angle dependent. The signal generator that performs operation 236 could be implemented according to well-known design techniques (analog and/or digital), e.g., using a compare circuit, such as an op amp or voltage comparator, to compare the amplitudes (voltage values) of the differential signals D1 and D2.

Another exemplary embodiment for generating D4 is illustrated in FIG. 9B in conjunction with FIG. 4C. The operation, shown in FIG. 9B as operation 250, begins (at block 252) with the receipt of D1, D2 and D3. The operation determines the amplitudes of D1, D2 and D3 from SE1, SE2 and SE3 (block 254). The operation determines D4 as a function of any mathematical combination of D1, D2, and D3 and/or SE1, SE2 and SE3 (block 256). The operation then normalizes D4 to be independent of orientation angle and air gap (block 257). The normalized D4 is provided as D4 at the output of the differential signal generation (block 258). Once the operation 250 has determined D4, the operation 250 ends (block 259).

In still yet another alternative embodiment, as illustrated in FIG. 9C, the operation for generating D4 involves orientation angle determination. Referring to FIG. 9C, the operation, shown in FIG. 9C as operation 260, begins (at block 262) with the receipt of D1, D2 and D3 as inputs and determines the amplitudes of D1, D2 and D3 (block 264). The operation 260 then uses the amplitudes to determine the orientation angle α (block 266). The operation 260 provides the orientation angle α as an output (block 268) and ends (block 270).

It will be appreciated that the functionality of the D4 signal generator, e.g., differential signal generator 66, 66', 66"or 66'" (from FIG. 4A-4D) or 66 (from FIG. 6), as depicted in the operations of FIGS. 9A-9C, can be implemented in hardware or combination of hardware and software according to known circuit design techniques.

As noted earlier, the sensing elements may be arranged so that the angle between the differential channels' respective sensing axes is an angle other than 90 degrees. That angle could be chosen to suit the needs of an application.

Although the illustrated figures show a transition-based peak detection, it will be appreciated that when the differential signals D1 and D2 cross in the middle of the profile features, e.g., in the middle of tooth and valley for a ferrous target or in the middle of the North pole and South pole for a magnetic target (as can be seen in FIGS. 7B, 7D and 7F), a non-transition-based detection that uses that signal crossing is possible. Such a detection scheme may be advantageous for some applications.

The orientation independent magnetic field sensor, like sensor 60, 60', 60" or 60'" (FIGS. 4A-4D) or sensor 140 (FIG. 6), with a multi-channel arrangement of sensing elements, as described above, may be used in a variety of applications. It is particularly well suited to use in rotational speed detection and timing control in automotive applications such as in anti-lock braking systems (ABS), transmissions and crankshafts, among others. For example, rotational speed information produced by a sensor may be used by speedometers, tachometers, on-board computers, tachographs (also known as chronotachographs), and the like. One example automotive application, as shown in FIG. 10, is an automotive application 280 that uses the sensor output in a tachograph.

The type of orientation independent differential sensor described herein is uniquely well suited to the needs of tachograph systems. For reasons of road safety, the driving time of drivers of certain vehicles, in particular, commercial vehicles such as buses and trucks, is now subject to regulation in some countries and regions. The tachograph (or equivalent electronic log device) can be used to monitor a driver's working conditions, i.e., driving time and rest periods, to ensure that appropriate driving breaks are taken. However, tachographs typically use a single-element sensor and the single-element sensor is vulnerable to tampering. It is possible to manipulate the sensor operation, e.g., by introducing a high magnetic field near the sensor to magnetically saturate the element so that the sensor doesn't switch (and therefore, does not indicate rotations properly), thus "tricking" the tachograph into giving a false record of driver information so that drivers can drive more hours.

One solution to this particular type of tachograph system tampering is to use a differential magnetic field sensor. As a differential sensor only responds to changes in magnetic field strength, it is relatively immune to the influence of extraneous magnetic fields (as well as machine vibrations). Unlike single-element sensors, prior differential sensors required correct positioning of the sensor in reference to the profile of the target special, as noted earlier, to operate properly. The orientation independent sensor such as sensor 60 (from FIG. 4A, or other sensor embodiments shown in FIGS. 4B-4D or FIG. 6) addresses the limitations of prior differential sensors, thus making it a good fit for tachograph systems and other applications that may benefit from both the differential mode of operation and ease of use (in terms of installation and maintenance). It is particularly advantageous for applications that require frequent sensor replacement, as is the case for some automotive applications (e.g., mandatory replacement intervals for ABS sensors in trucks). Since tachographs record speed, this technique might also be useful in speed limiter systems to control maximum speed in certain commercial vehicles.

Figure 10:
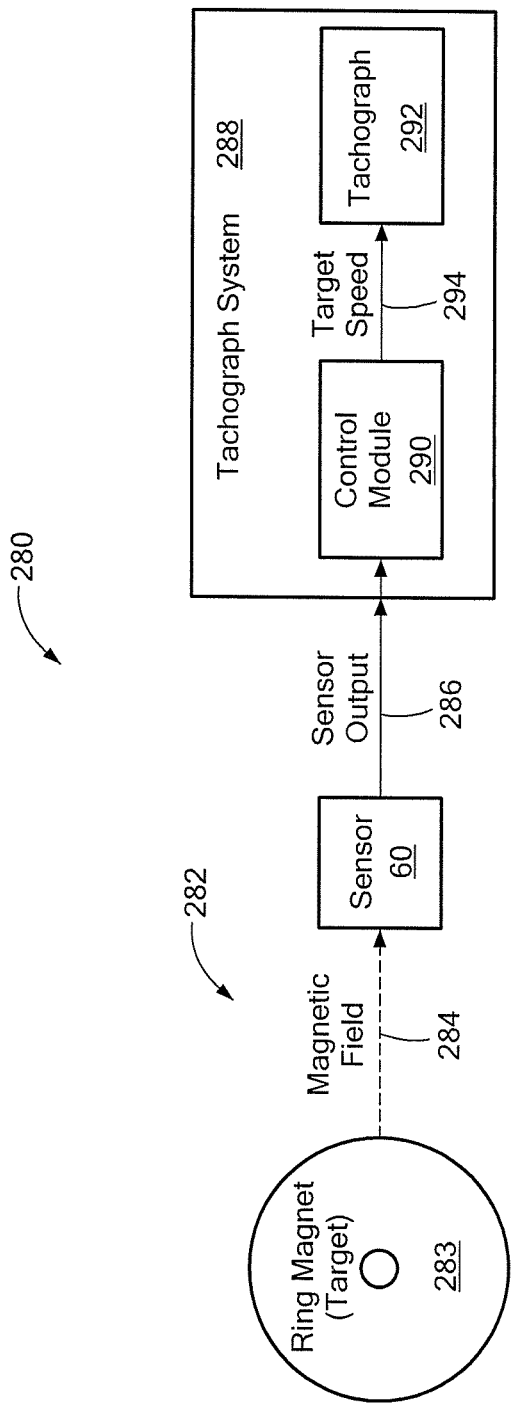
FIG. 10 is a functional block diagram of an exemplary automotive application in which an orientation independent differential magnetic field sensor (such as those depicted in FIGS. 4A-D and FIG. 6) is employed.

Turning now to FIG. 10, the application 280 includes a sensing arrangement 282 in which a sensor such as sensor 60 (from FIG. 4, or sensor 60', 60", 60'" or 140 from FIG. 4B, FIG. 4C, FIG. 4D and FIG. 6, respectively) is located near a target such as a ring magnet 283, as shown. The sensor is mounted (installed) in close proximity to the ring magnet, which rotates at wheel speed. The sensor 60 senses changes in magnetic field 284 associated with the rotating target's profile. The sensor 60 produces a rotation-indicating output 286 for the target 283 and provides that output to a tachograph system 288. In the illustrated example, the tachograph system 288 includes a control module 290 coupled to a tachograph 292. The control module 290 receives the sensor output 286 and translates that sensor output to a target (in this example, wheel) speed 294.

The sensing arrangement 282 may be located on an axle shaft, gear or wheel hub. Although only one sensing arrangement is shown, it will be appreciated that multiple sensor arrangements (e.g., one for each vehicle wheel) could be used.

As discussed earlier, the main advantage of the orientation independent magnetic field sensing structure is that the structure offers increased design flexibility to the end user in terms of sensor mounting for applications where the orientation of the sensor relative to the target cannot be precisely controlled. For example, the sensor could be mounted into a threaded canister that could simply be screwed into a corresponding threaded hole in the front of the target. This type of structure could greatly simplify the regular change of sensor modules required for some applications, like truck ABS applications.

Other possible applications besides automotive include motor, industrial and assembly. Also, although the orientation angle independent techniques and designs have been illustrated herein with reference to rotary sensing, they would be applicable to linear movement sensing as well. If the orientation angle is determined, the angle information could be provided as feedback to the user (to indicate a misalignment condition), or to other circuitry or processing elements for compensation, calibration or other purposes. The orientation angle independent techniques and designs described herein may be suitable for use in any magnetically noisy environment, as they allow for a clean signal independent of orientation of sensor relative to a target and independent of DC magnetic perturbations.

All references cited herein are hereby incorporated herein by reference in their entirety.

Having described preferred embodiments of the invention, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

What is claimed is:

1. A differential magnetic field sensor comprising:
    a first differential channel comprising a first pair of magnetic field sensing elements and having an associated first sensing axis defined by the first pair of magnetic field sensing elements;
    a second differential channel comprising a second pair of magnetic field sensing elements and having a second sensing axis defined by the second pair of magnetic field sensing elements;
    wherein the second sensing axis is not aligned with respect to the first sensing axis, and the first sensing axis is positioned relative to a reference axis of a target profile, the reference axis aligned with a direction of motion of the target profile, to define an orientation angle between the first sensing axis and the reference axis; and
    circuitry, coupled to the magnetic field sensing elements, to produce an output signal having an amplitude that is independent of the orientation angle.

2. The differential magnetic field sensor of claim 1 wherein one of the magnetic field sensing elements in each of the pairs of magnetic field sensing elements is shared by the first and second differential channels.

3. The differential magnetic field sensor of claim 1 wherein the second sensing axis is at an angle relative to the first sensing axis and the angle is substantially a 90 degree angle.

4. The differential magnetic field sensor of claim 1 wherein the spacing between the magnetic field sensing elements of each of the pairs of magnetic field sensing elements is substantially the same.

5. The differential magnetic field sensor of claim 1 wherein none of the magnetic field sensing elements are shared by the first and second differential channels.

6. The differential magnetic field sensor of claim 1 further comprising at least two pairs of magnetic field sensing elements including the first and second pairs of the magnetic field sensing elements and wherein the number of magnetic field sensing elements in the at least two pairs of the magnetic field sensing elements is more than three.

7. The differential magnetic field sensor of claim 1 wherein each of the magnetic field sensing elements is a selected one of a Hall-effect element, magnetoresistance (MR) element or other type of magnetic field sensitive element.

8. The differential magnetic field sensor of claim 1 wherein material used to implement each of the sensing elements is a selected one of IV-type semiconductor material or a III-V-type semiconductor material.

9. The differential magnetic field sensor of claim 1 wherein the circuitry comprises circuitry to produce a first signal associated with the first differential channel and a second signal associated with the second differential channel and the circuitry further comprises a signal generator to receive as inputs the first and second signals and to produce the output signal.

10. The differential magnetic field sensor of claim 9 wherein the first and second signals have amplitudes that are dependent on the orientation angle.

11. The differential magnetic field sensor of claim 9 wherein the first signal has a first amplitude and the second signal has a second amplitude, and wherein the signal generator is operable to select the first signal as the output signal when an absolute value of the first amplitude is greater than an absolute value of the second amplitude and the second circuitry is operable to select the second signal as the output signal when the absolute value of the first amplitude is not greater than the absolute value of the second amplitude.

12. The differential magnetic field sensor of claim 9 wherein the circuitry further comprises circuitry to receive as inputs a first magnetic field sensing output signal associated with the first sensing element, a second magnetic field sensing output signal associated with the second sensing element and a third magnetic field sensing output signal associated with the third sensing element, and wherein the signal generator is operable to produce the output signal by mathematically combining any two or more of the first magnetic field sensing output signal, the second magnetic field sensing output signal, the third magnetic field sensing output signal, the first signal and the second signal.

13. The differential magnetic field sensor of claim 1 further comprising
a third differential channel comprising a third pair of magnetic field sensing elements and having a third sensing axis defined by the third pair of magnetic field sensing elements;
a fourth differential channel comprising a fourth pair of magnetic field sensing elements and having a fourth sensing axis defined by the fourth pair of magnetic field sensing elements;
wherein the third sensing axis is aligned with the first sensing axis to form a first single sensing axis and the fourth sensing axis is aligned with the second sensing axis to form a second single sensing axis, and wherein the two pairs of magnetic field sensing elements associated with each of the first and second single sensing axes include at least three magnetic field sensing elements;
wherein the circuitry, coupled to the magnetic field sensing elements, is usable to produce, for the third and fourth channels, a second signal having an amplitude that is independent of orientation angle as a second output; and
wherein the output is usable to provide rotational speed information and the second output is usable to produce rotation direction information for a rotational target.

14. A system comprising:
a rotational target having a target profile; and
a differential magnetic field sensor positioned in proximity to the target profile;
wherein the differential magnetic field sensor comprises:
a first differential channel comprising a first pair of magnetic field sensing elements and having an associated first sensing axis defined by the first pair of magnetic field sensing elements;
a second differential channel comprising a second pair of magnetic field sensing elements and having a second sensing axis defined by the second pair of magnetic field sensing elements;
wherein the second sensing axis is not aligned with respect to the first sensing axis, and the first sensing axis is positioned relative to a reference axis of a target profile, the reference axis aligned with a direction of motion of the target profile, to define an orientation angle between the first sensing axis and the reference axis; and
circuitry, coupled to the magnetic field sensing elements, to produce an output signal having an amplitude that is independent of orientation angle.

15. The system of claim 14 wherein one of the magnetic field sensing elements in each of the pairs of magnetic field sensing elements is shared by the first and second differential channels.

16. The system of claim 14 wherein the second sensing axis is at an angle relative to the first sensing axis and the angle is substantially a 90 degree angle.

17. The system of claim 14 wherein the spacing between the magnetic field sensing elements of each of the pairs of magnetic field sensing elements is substantially the same.

18. The system of claim 14 wherein none of the magnetic field sensing elements are shared by the first and second differential channels.

19. The system of claim 14 comprising at least two pairs of magnetic field sensing elements including the first and second pairs of the magnetic field sensing elements and wherein the number of magnetic field sensing elements in the at least two pairs of the magnetic field sensing elements is more than three.

20. The system of claim 14 wherein each of the magnetic field sensing elements is a selected one of a Hall-effect element, magnetoresistance (MR) element or other type of magnetic field sensitive element.

21. The system of claim 14 wherein material used to implement each of the sensing elements is a selected one of IV-type semiconductor material or a III-V-type semiconductor material.

22. The system of claim 14 wherein the circuitry comprises circuitry to produce a first signal associated with the first differential channel and a second signal associated with the second differential channel and the circuitry further comprises a signal generator to receive as inputs the first and second signals and to produce the output signal.

23. The system of claim 22 wherein the first and second signals have amplitudes that are dependent on the orientation angle.

24. The system of claim 14 wherein the first signal has a first amplitude and the second signal has a second amplitude, and wherein the signal generator is operable to select the first signal as the output signal when an absolute value of the first amplitude is greater than an absolute value of the second amplitude and the second circuitry is operable to select the second signal as the output signal when the absolute value of the first amplitude is not greater than the absolute value of the second amplitude.

25. The system of claim 16 wherein the circuitry further comprises circuitry to receive as inputs a first magnetic field sensing output signal associated with the first sensing element, a second magnetic field sensing output signal associated with the second sensing element and a third magnetic field sensing output signal associated with the third sensing element, and wherein the signal generator is operable to produce the output signal by mathematically combining any two or more of the first magnetic field sensing output signal, the second magnetic field sensing output signal, the third magnetic field sensing output signal, the first signal and the second signal.

26. The system of claim 14 wherein the rotational target is a magnetic target and the target profile comprises alternating magnetic poles.

27. The system of claim 14 wherein the rotational target is a ferrous target and the target profile comprises tooth and valley features.

28. The system of claim 14 wherein the differential magnetic field sensor further comprises:
  a third differential channel comprising a third pair of magnetic field sensing elements and having a third sensing axis defined by the third pair of magnetic field sensing elements;
  a fourth differential channel comprising a fourth pair of magnetic field sensing elements and having a fourth sensing axis defined by the fourth pair of magnetic field sensing elements;
  wherein the third sensing axis is aligned with the first sensing axis to form a first single sensing axis and the fourth sensing axis is aligned with the second sensing axis to form a second single sensing axis, and wherein the two pairs of magnetic field sensing elements associated with each of the first and second single sensing axes include at least three magnetic field sensing elements;
  wherein the circuitry, coupled to the magnetic field sensing sensing elements, is usable to produce, fir the third and fourth channels, a second signal having an amplitude that is independent of orientation angle as a second output; and
  wherein the output is usable to provide rotational speed information and the second output is usable to produce rotation direction information for the rotational target.

* * * * *

UNITED STATES PATENT AND TRADEMARK OFFICE
CERTIFICATE OF CORRECTION

PATENT NO. : 8,729,892 B2
APPLICATION NO. : 13/078200
DATED : May 20, 2014
INVENTOR(S) : Andreas P. Friedrich It is certified that error appears in the above-identified patent and that said Letters Patent is hereby corrected as shown below:

IN THE SPECIFICATION

Column 2, line 41 delete "signal," and replace with --signals,--.

Column 10, line 65 delete "retelling" and replace with --referring--.

IN THE CLAIMS

Column 20, line 21 delete ", fir" and replace with --, for--.

Signed and Sealed this
Twenty-fourth Day of November, 2015

Michelle K. Lee
*Director of the United States Patent and Trademark Office*